United States Patent
Dulman et al.

(10) Patent No.: US 7,008,738 B2
(45) Date of Patent: **\*Mar. 7, 2006**

(54) MICROLITHOGRAPHIC STRUCTURES AND METHOD OF FABRICATION

(75) Inventors: H. Daniel Dulman, Boise, ID (US); William A. Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/847,337

(22) Filed: May 18, 2004

(65) Prior Publication Data
US 2004/0214096 A1    Oct. 28, 2004

Related U.S. Application Data

(63) Continuation of application No. 09/917,697, filed on Jul. 31, 2001, now Pat. No. 6,803,155.

(51) Int. Cl.
*G03F 9/00*        (2006.01)
(52) U.S. Cl. ......................................................... 430/5
(58) Field of Classification Search .................... 430/5, 430/30, 22; 378/34, 35; 716/19
See application file for complete search history.

(56) References Cited

U.S. PATENT DOCUMENTS

| | | | |
|---|---|---|---|
| 5,049,925 A | 9/1991 | Aiton et al. | |
| 5,242,770 A | 9/1993 | Chen et al. | |
| 5,447,810 A | 9/1995 | Chen et al. | |
| 5,582,939 A | 12/1996 | Pierrat | |
| 5,707,765 A | 1/1998 | Chen | |
| 5,821,014 A | 10/1998 | Chen et al. | |
| 6,022,644 A | 2/2000 | Lin et al. | |
| 6,077,633 A | 6/2000 | Lin et al. | |
| 6,114,071 A | 9/2000 | Chen et al. | |
| 6,294,295 B1 | 9/2001 | Lin et al. | |
| 6,803,155 B1 * | 10/2004 | Dulman et al. | 430/5 |

OTHER PUBLICATIONS

Robert J. Socha et al.—"Design of 200nm, 170nm, 140nm DUV Contact Sweeper High Transmission Attenuating Phase Shift Mask through Simulation Part 1," Proc. Of SPIE, vol. 3546, 1998, pp. 1-25.
Robert J. Socha et al.—"Design of 200nm, 170nm, 140nm DUV Contact Sweeper High Transmission Attenuating Phase Shift Mask: Experimental Results Part 2," Proc. of SPIE, vol. 3679, 1999, pp. 1-17.

* cited by examiner

*Primary Examiner*—Saleha R. Mohamedulla
(74) *Attorney, Agent, or Firm*—Dickstein Shapiro Morin & Oshinsky LLP

(57) ABSTRACT

A method of formulating and fabricating a mask pattern and resulting mask for forming isolated or closely spaced contact holes in an integrated circuit. The mask has a transparent mask substrate and patterned regions of attenuating phase shift material and opaque, partially transmissive or transparent material arranged to reduce the effect of side lobes and improve depth of focus. The rims, frames and outrigger patterns for the attenuating phase shift material and opaque, partially transmissive or transparent material are determined according to calculations performed on a processor with imaging software for various optical conditions and exposed feature criteria.

29 Claims, 28 Drawing Sheets

MICROLITHOGRAPHIC STRUCTURES AND METHOD OF FABRICATION

The present application is a continuation of application Ser. No. 09/917,697, filed Jul. 31, 2001, now U.S. Pat. No. 6,803,155, the entire disclosure of which is incorporated herein by reference.

BACKGROUND OF THE INVENTION

1. Field of the Invention

The present invention relates to masks (or reticles) and other devices for use in microlithographic techniques, especially for use in forming contact holes in semiconductor products with improved depth of focus. The invention may be used to form isolated contact holes, arrays of contact holes and other structures. The present invention also relates to a method of determining a desired three-tone pattern for a microlithographic mask. The method, which may be performed on one or more programmed microprocessors, may involve the selection of one set of dimension data out of a plurality of dimension data sets, where the dimension data sets correspond to different mask patterns, and the selected set is the one that provides the greatest depth of focus.

2. Description of Related Art

A semiconductor device can be fabricated by photolithography, in which light is transmitted through a patterned mask (or reticle). The pattern on the mask is exposed on a layer of photoresist to form the desired feature or features in the semiconductor device. Examples of such features are isolated contact holes and contact holes formed in closely packed arrays. In certain circumstances, it is desirable to make contact holes with very small critical dimensions. The "critical dimension" is typically the diameter of the hole in the plane of the surface of the semiconductor device. Some devices require contact holes with critical dimensions that are less than the wavelength of the light that is used to expose the photoresist. A dimension that is less than the wavelength of the exposing light is referred to as a "sub-resolution" dimension.

A number of binary and phase-shifting masks have been proposed in the prior art. Such masks are shown, for example, in U.S. Pat. No. 6,114,071 (Chen et al.), U.S. Pat. No. 6,077,633 (Lin et al.), U.S. Pat. No. 6,022,644 (Lin et al.) and U.S. Pat. No. 5,707,765 (Chen). There is still a need in the art, however, for a three-tone mask (or other multi-tone mask) that can form holes and other structures with small critical dimensions and minimum side-lobing and with improved depth of focus. Depth of focus is especially important in connection with the formation of small structures in non-flat surfaces. Where the wafer is not flat, it may be necessary to image a pattern at different distances from the lithography system with essentially the same fidelity. In addition, it may be necessary to allow for wafer positioning in the system, wafer curvature, focal plane curvature, etc.

Moreover, there is a need in the art for an economical method of making three-tone masks (or other multi-tone masks) for use in the formation of small critical dimension features with minimal side-lobing and large depth of focus.

SUMMARY OF THE INVENTION

The present invention relates to a microlithographic mask for forming a sub-resolution feature in photoresist with improved depth of focus. As noted above, the term "sub-resolution" means that the critical dimension of the feature formed in the photoresist is less than the wavelength of the exposing light. According to one aspect of the invention, the mask has a three-tone structure, with a layer of transparent material, a layer of attenuating phase-shifting material overlying the transparent material, and a layer of light-obstructing material (i.e., opaque material and/or partially transmissive material) overlying the phase-shifting material. In a preferred embodiment of the invention, the layer of attenuating phase-shifting material is located between the transparent material and the light-obstructing material. The present invention should not be limited, however, to the specific features of the preferred embodiments shown and described in detail herein.

According to another aspect of the invention, opaque material and the attenuating phase-shifting material are patterned to form a square transparent opening, one or more partially transmissive assist features, which may include a rectangular frame, and an opaque frame and/or background. The opaque frame may be located at the edge of the opening (interposed between a partially transmissive assist feature and the transparent opening). Alternatively, opaque squares, triangles or other polygons can be placed at the corners (or inside) of a partially transmissive frame to control the exposure pattern of the light that is transmitted through the partially transmissive frame.

The transparent material may be quartz or another suitable material. The partially transmissive material causes a phase shift (e.g., 180° or an odd multiple thereof) relative to the light transmitted through the transparent material. The partially transmissive material also attenuates the phase-shifted light relative to the non-phase-shifted light. The transmissivity of the partially transmissive material relative to the transparent material may be in the range, for example, of from about 6% to 100%, more preferably from about 8% to about 24%. The partially transmissive material may be, for example, MoSi. The opaque material may be a metal such as chrome, and other suitable materials may be employed as desired.

The present invention may be used to form a variety of microlithographic features. The invention is especially well suited, however, for forming a contact hole that has a large aspect ratio of depth to width. The invention is also well suited to forming other structures where a large depth of focus is desirable, such as microlithographic features on substantially non-flat surfaces. According to one aspect of the invention, improved depth of focus is achieved by providing sub-resolution assist features that are patterned in the opaque material and/or the partially transmissive material.

The present invention also relates to masks for forming regular and asymmetric arrays of features, such as arrays of high aspect ratio contact holes. According to one aspect of the invention, elongated assist bars (of partially transmissive material and/or opaque material) are employed to interact with an array of transparent openings. According to another aspect of the invention, phase-shifting assist features are nested within transparent bars.

The present invention also relates to a method of forming elliptical holes and other structures with small critical dimensions and improved depth of focus. The holes may be isolated structures or they may be formed in a dense array.

The present invention also relates to a method of making a multi-tone microlithographic mask. The method, which may be performed at least in part on a digital microprocessor, includes the steps of: (1) providing sets of dimension data representative of multiple mask patterns; (2) for each set of dimension data, calculating feature dimension data as a function of optical conditions; and (3) for a desired optical condition, identifying the sets of dimension data that correlate to feature dimension data within desired limits. If desired, the method may also include the step of (4) selecting the one identified set of dimension data that achieves the smallest change in critical dimension between a zero defocus condition and a maximum considered defocus condition.

In a preferred embodiment of the invention, steps (1) and (2) are performed using a computer programmed with PERL/solid-c imaging software. Steps (3) and (4) may be performed using Visual BASIC/Excel software. As noted above, however, the present invention should not be limited to the specific features of the preferred embodiments.

The dimension data can include the widths of transparent openings and the corresponding dimensions of the opaque and partially transmissive assist features. There may be one set of such dimension data for each pattern under consideration. The limits considered in step (3) may include the critical dimension for the exposed feature, the allowable (or desirable) ellipticity, the absence of sidelobes, log-slope, etc. These limits operate to exclude patterns that do not form acceptable features at the desired operating conditions. Once a desired pattern is determined, the pattern is formed in layers of deposited partially transmissive and opaque materials to form the finished mask. As noted above, the two upper layers of the mask may be deposited on a layer of transparent quartz.

These and other advantages and features of the invention will be more readily understood from the following detailed description of the invention which is provided in connection with the accompanying drawings.

DETAILED DESCRIPTION OF EXEMPLARY EMBODIMENTS

Figure 1:
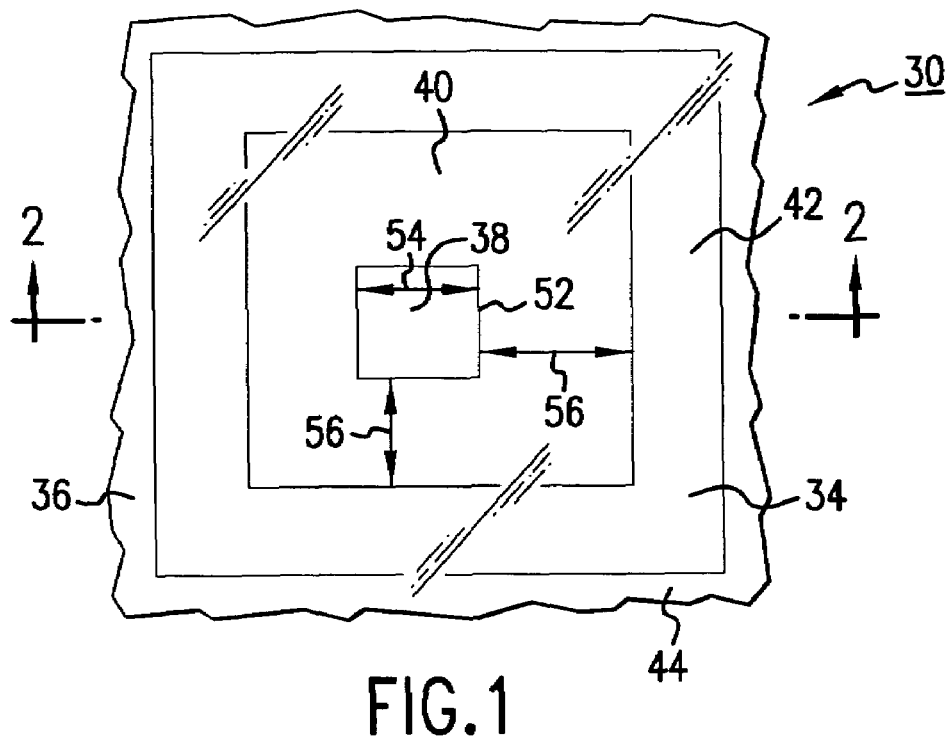
FIG. 1 is a plan view of a mask constructed in accordance with a preferred embodiment of the invention.

Referring now to the drawings, where like reference numerals designate like elements, there is shown in FIG. 1 a microlithographic mask 30 for forming an isolated contact hole (not shown) in photoresist (not shown). The mask 30 is formed of a transparent substrate 32 (FIG. 2), an attenuating phase shift layer 34, and an opaque layer 36. The attenuating phase shift layer 34 and the opaque layer 36 are patterned to define a square transparent opening 38, a rectangular opaque frame 40 (FIG. 1), a partially transmissive outrigger frame 42, and an opaque background 44. In the illustrated embodiment, the inner edges of the opaque frame 40 define transparent opening 38.

In operation, incident light 46 (FIG. 2) is transmitted through the opening 38 and the outrigger frame 42. The incident light 46 may be generated by a suitable source (not shown) located above the mask 30. The incident light 46 is prevented from passing through the opaque material 40, 44. The light 46, 48 that is transmitted through the outrigger frame 42 is phase-shifted (by 180° or an odd multiple thereof) relative to the light 46, 50 that is transmitted through the transparent opening 38. In addition, the outrigger frame 42 attenuates the phase-shifted light 48 relative to the non-phase-shifted light 50. The attenuated phase-shifted light 48 interacts with the non-phase-shifted light 50 to form the contact hole in the photoresist.

In the illustrated embodiment, the opaque frame 40 causes the partially transmissive outrigger frame 42 to be effectively spaced apart from the edges 52 of the transparent opening 38. That is, the opaque frame 40 is interposed between the transparent opening 38 and the partially transmissive frame 42. By blocking the incident light 46 between the transparent opening 38 and the outrigger frame 42, the contact hole can be formed in the shape of a cylinder (with minimal side lobing) with improved depth of focus. In a preferred embodiment, the cylindrical contact hole may be formed with a depth of focus of about 0.8 microns ($\mu$m) or greater. The depth of focus determines the length of the cylindrical hole that can be formed in the photoresist without unacceptable side-lobing. The depth of focus also characterizes the ability of the mask 30 to be used to form sub-resolution features in non-flat photoresist surfaces.

In the illustrated embodiment, the substrate 32 is formed of quartz, the attenuating phase shift layer 34 is formed of MoSi, and the opaque layer 36 is formed of chrome. The transmissivity of the attenuating phase shift layer 34 may be about 18% when the wavelength of the incident light is about 248 nanometers (nm). The transmissivity of the transparent quartz layer 32 may be essentially 100%. Other suitable materials may be employed in the mask 30, and additional layers may be provided, if desired. Further, the width 54 of the transparent opening 38 is about 0.14 $\mu$m. The diameter of the hole (not shown) formed by the mask 30 is about 0.12 $\mu$m (less than the wavelength of the incident light 46) in the exposed photoresist. The width 56 of the opaque frame 40 is about 0.125 $\mu$m, and the width 58 of the outrigger frame 42 is about 0.115 $\mu$m. The incident light 46 is propagated with a numerical aperture (NA) of about 0.63 and a sigma ($\sigma$) of about 0.35. The thickness of the three layers 36, 34, 32 may be 700 to 1000 Angstroms, 800 to 1200 Angstroms, and one-quarter inch, respectively. The present invention should not be limited, however, to the specific materials, dimensions and instrumentalities of the preferred embodiments shown and described in detail herein. As mentioned below, the scope of the invention should be defined by the appended claims.

Figure 3:
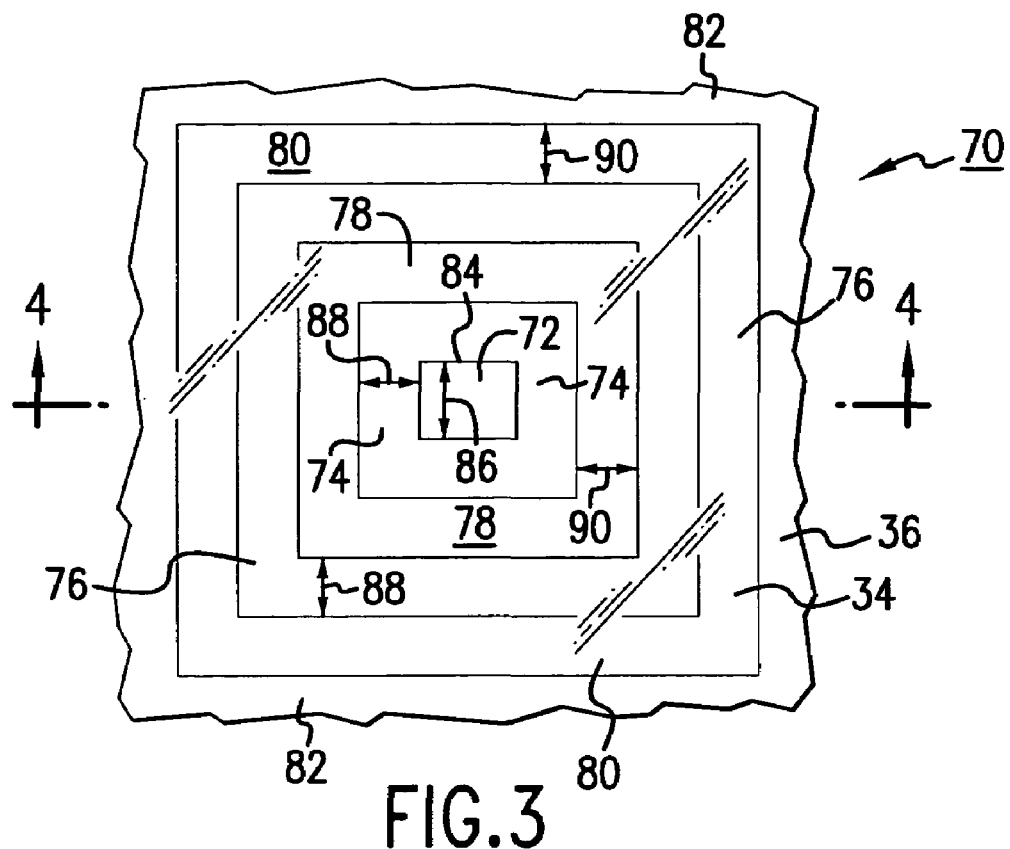
FIG. 3 is a plan view of another mask constructed in accordance with the invention.
Figure 4:
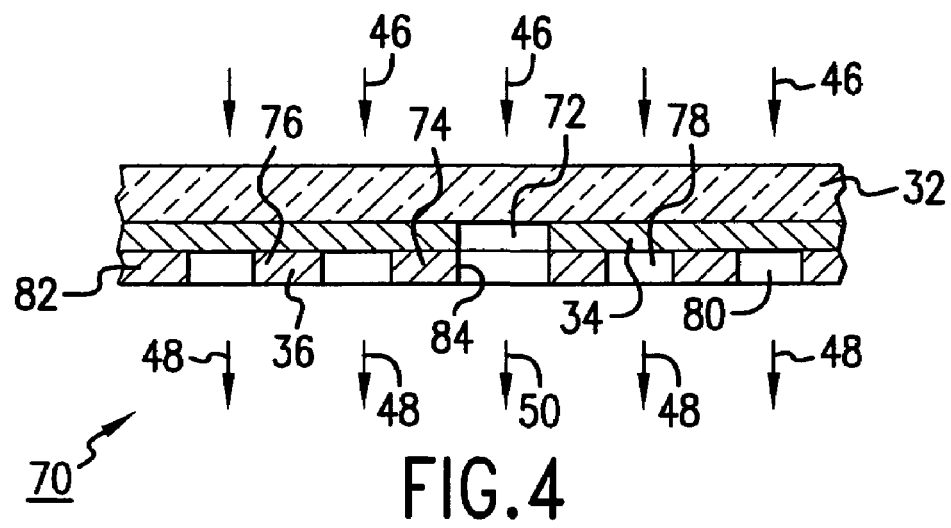
FIG. 4 is a cross-sectional view of the mask of FIG. 3, taken along the line 4—4.

Referring now to FIGS. 3 and 4, there is shown a mask 70 for forming an isolated cylindrical contact hole (not shown) in photoresist (not shown). The mask 70 includes a transparent substrate 32, an attenuating phase shift layer 34, and an opaque layer 36. The attenuating phase shift layer 34 and the opaque layer 36 are patterned to define a square transparent opening 72, rectangular, nested opaque frames 74, 76, rectangular, nested partially transmissive outrigger frames 78, 80, and an opaque background 82.

In operation, incident light 46 is transmitted through the opening 72 and the outrigger frames 78, 80. The incident light 46 is prevented from passing through the opaque material 74, 76, 82. The light 46, 48 that is transmitted through the outrigger frames 78, 80 is phase-shifted (by 180° or an odd multiple thereof) relative to the light 46, 50 that is transmitted through the transparent opening 72. In addition, the phase-shifting layer 34 attenuates the phase-shifted light 48 relative to the non-phase-shifted light 50. The attenuated phase-shifted light 48 interacts with the non-attenuated, non-phase-shifted light 50 to form the cylindrical contact hole in the underlying, exposed photoresist (not shown).

In the illustrated embodiment, the opaque frames 74, 76 separate the partially transmissive outrigger frames 78, 80 from the edges 84 of the transparent opening 72 (and from each other). By blocking the incident light 46 between the transparent opening 72 and the outrigger frames 78, 80, the mask 70 of FIGS. 3 and 4 is able to form a cylindrically-shaped hole with a critical dimension (CD) of 0.12 $\mu$m and with a depth of focus of 0.8 $\mu$m or more. As in the embodiment of FIGS. 1 and 2, the attenuating phase shift layer 34 is formed of MoSi, and the opaque layer 36 is formed of chrome. The relative transmissivity of the phase shift layer 34 may be about 18%. The width 86 of the transparent opening 72 is about 0.16 $\mu$m. The width 88 of each opaque frame 74, 76 is about 0.085 $\mu$m, and the width 90 of each outrigger frame 78, 80 is about 0.11 $\mu$m. The mask 70 would be suitable for operation under the same optical and photoresist conditions described above in connection with FIGS. 1 and 2 (i.e., where NA is about 0.63, and $\sigma$ is about 0.35).

The structures shown in FIGS. 1–4 are frame-based structures. In each illustrated embodiment there is opaque material abutting the contact. Polygons of attenuated phase shift material, particularly scattering bars, lay around the contact. The claimed invention should not be limited, however, to the embodiments shown and described in detail herein.

The structures shown in FIGS. 5–8 are rim-based structures. In each embodiment there is attenuated phase shift material abutting the contact. Polygons, either opaque or transparent, or of another transmission, lay immersed inside the attenuated material or at either border, defining the form and size of the rim.

Figure 5:
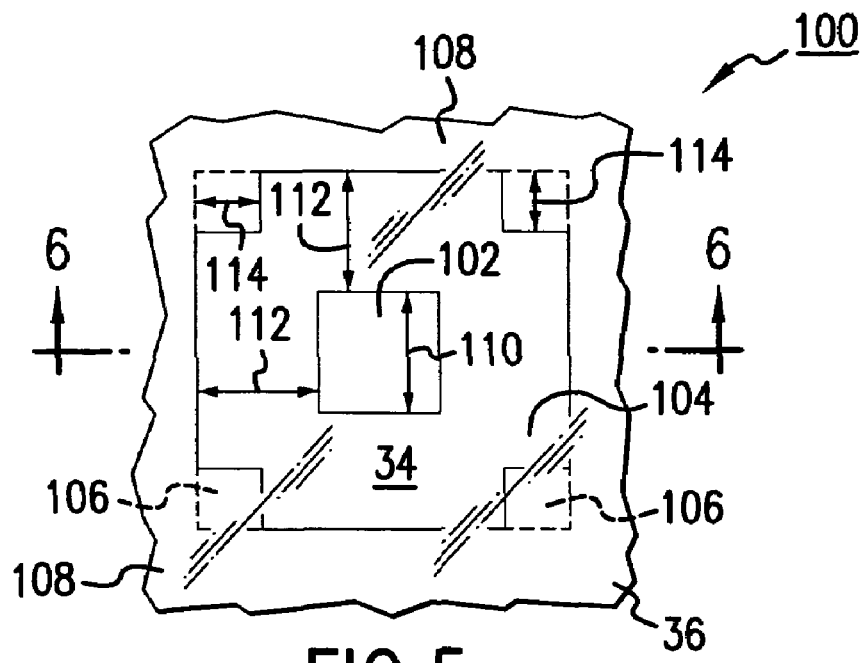
FIG. 5 is a plan view of another mask constructed in accordance with the invention.
Figure 6:
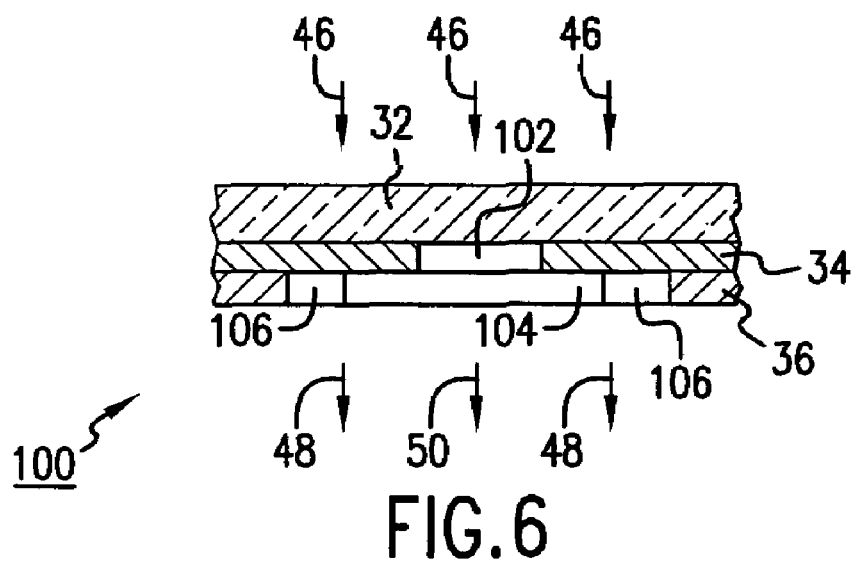
FIG. 6 is a cross-sectional view of the mask of FIG. 5, taken along the line 6—6.

Referring now to FIGS. 5 and 6, there is shown a mask 100 for forming an isolated cylindrical contact hole with improved depth of focus. The mask 100 includes a transparent substrate 32, an attenuating phase shift layer 34, and an opaque layer 36. The attenuating phase shift layer 34 and the opaque layer 36 are patterned to define a transparent opening 102, a partially transmissive rim 104, opaque corner squares 106, and an opaque background 108. In operation, incident light 46 is transmitted through the opening 102 and the rim 104. The incident light 46 is prevented from passing through the opaque material 106, 108. The light 46, 48 that is transmitted through the rim 104 is phase shifted (by 180° or an odd multiple thereof) and attenuated (to about 18%) relative to the light 46, 50 that is transmitted through the opening 102.

As in the embodiments of FIGS. 1–4, the attenuated, phase-shifted light 48 interacts with the non-attenuated, non-phase-shifted light 50 to form the contact hole with the desired geometry. The four opaque corner squares 106 cover the partially transmissive layer 34 and thereby contribute to the formation of a cylindrically-shaped contact hole without sidelobes. In the illustrated embodiment, the corner squares 106 separate the partially transmissive rim 104 into four short bars. By blocking the incident light 46 at points between the transparent opening 102 and the opaque background 108, the contact hole can be formed with minimal side-lobing and with improved depth of focus.

In the illustrated embodiment, the width 110 of the transparent opening 102 is about 0.21 μm, and the CD of the hole (not shown) formed by the mask 100 is about 0.12 μm. The width 112 of the partially transmissive rim 104 is about 0.24 μm, and the width 114 of the square corners 106 is about 0.19 μm. The mask 100 may be operated under the same optical and photoresist conditions as those described above in connection with FIGS. 1 and 2.

Figure 7:
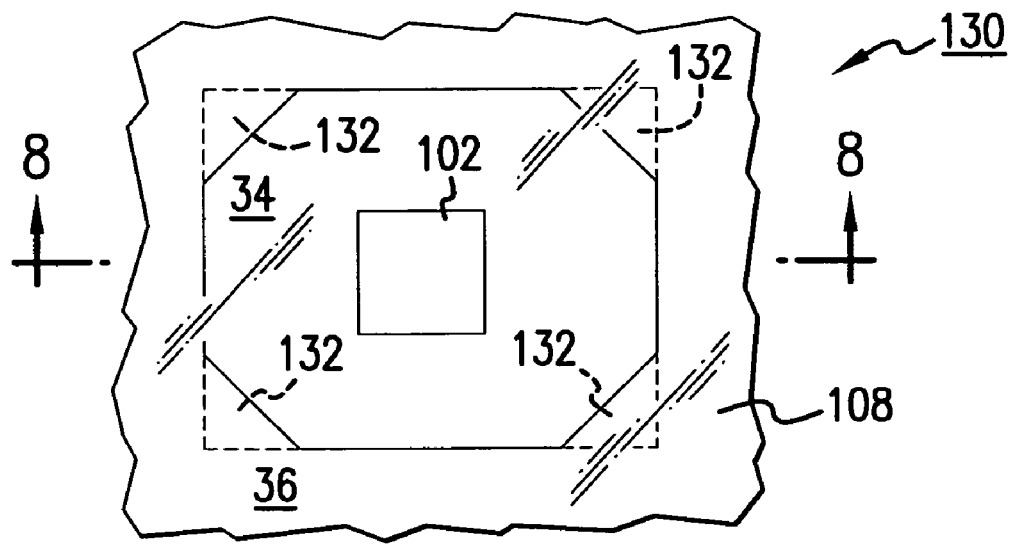
FIG. 7 is a top view of another mask constructed in accordance with the invention.
Figure 8:
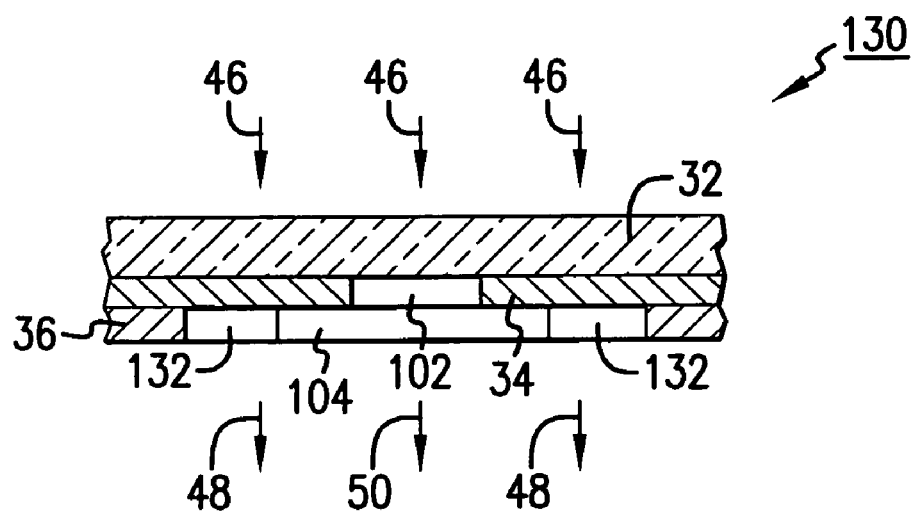
FIG. 8 is a cross-sectional view of the mask of FIG. 7, taken along the line 8—8.

The mask 130 shown in FIGS. 7 and 8 is similar to the mask 100 shown in FIGS. 5 and 6 except that the opaque corners 132 in the FIGS. 7 and 8 embodiment are triangular to provide improved side-lobing control.

Figure 9:
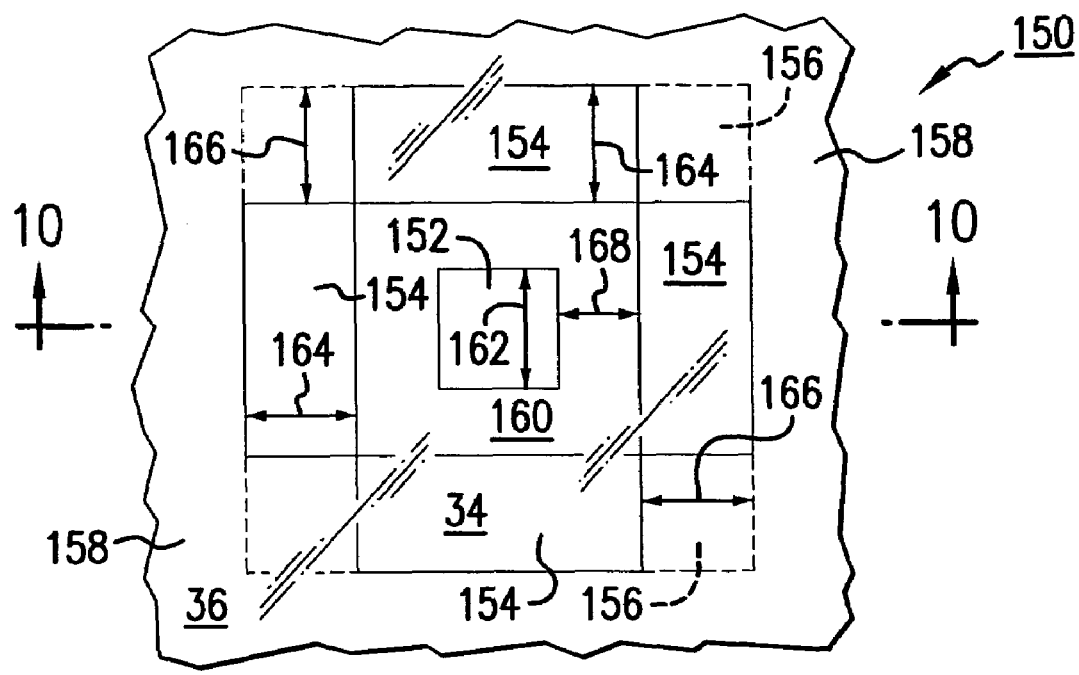
FIG. 9 is a plan view of another mask constructed in accordance with the invention.
Figure 10:
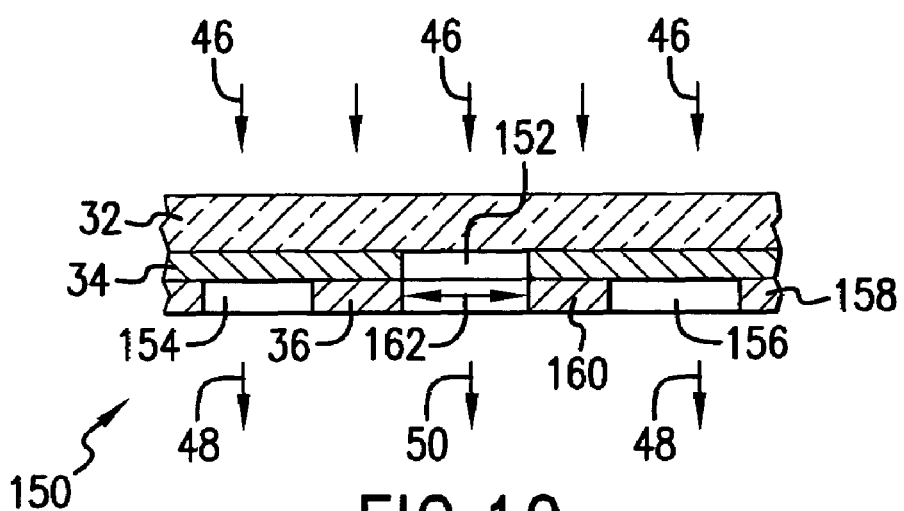
FIG. 10 is a cross-sectional view of the mask of FIG. 9, taken along the line 10—10.

The structures shown in FIGS. 9–12, like those shown in FIGS. 1–4, are frame-based structures. Referring now to FIGS. 9 and 10, there is shown yet another mask 150 for forming an isolated cylindrical contact hole with improved depth of focus. The mask 150 has a square transparent opening 152, a partially transmissive short bar frame 154, opaque corner squares 156 at the ends of the short bars of the frame 154, and an opaque background 158. In operation, incident light 46 is transmitted through the opening 152 and the frame 154. The light 46 is prevented from passing through the opaque material 156, 158, 160. The light 46, 48 that is transmitted through the short bar frame 154 is phase-shifted (by 180° or an odd multiple thereof) and attenuated (to about 18%) relative to the light 46, 50 that is transmitted through the opening 152. The attenuated phase-shifted light 48 interacts with the non-phase-shifted light 50 to expose the photoresist such that the formed hole has the desired geometry.

Figure 2:
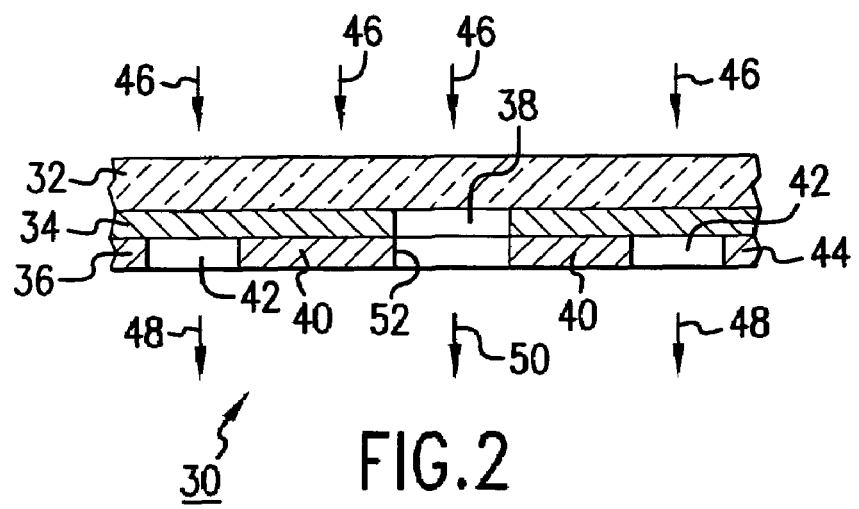
FIG. 2 is a cross-sectional view of the mask of FIG. 1, taken along the line 2—2.

The opaque frame 160, like the frame 40 of the FIGS. 1 and 2 embodiment, optically separates the partially transmissive frame 154 from the transparent opening 152, to achieve improved depth of focus. The opaque corner squares 156 operate like the squares 106 of FIGS. 5 and 6 to spatially and selectively control the transmission of light through the frame 154, to thereby make it easier to ensure that the contact hole has the desired cylindrical geometry, depth of focus and eliminate sidelobes.

In the illustrated embodiment, the width 162 of the transparent opening 152 is about 0.15 μm. The CD of the hole (not shown) formed by the mask 150 is about 0.12 μm. The width 164 of the partially transmissive frame 154 is about 0.15 μm, and the width 166 of the overlapping square corners 156 is likewise about 0.15 μm. The width 168 of the opaque frame 160 (i.e., the separation of the partially transmissive frame 154 from the transparent opening 152 in orthogonal directions) is about 0.10 μm. The mask 150 may be operated under the same optical and photoresist conditions as those described above in connection with FIGS. 1 and 2.

Figure 11:
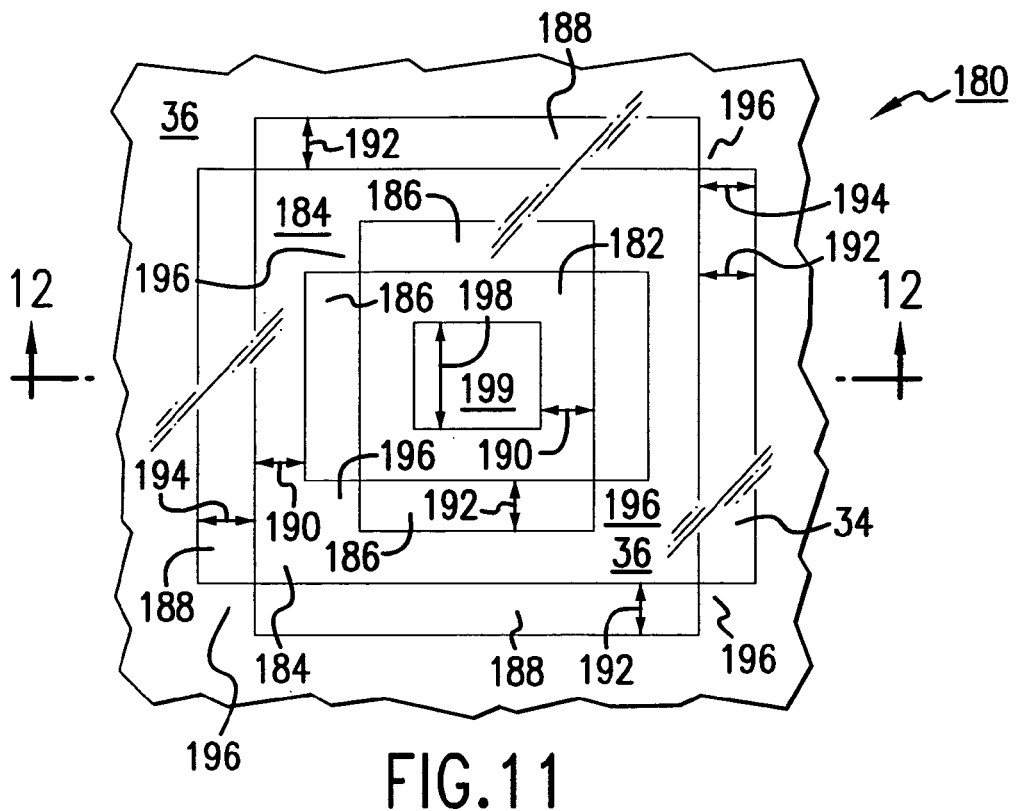
FIG. 11 is a plan view of another mask constructed in accordance with the invention.
Figure 12:
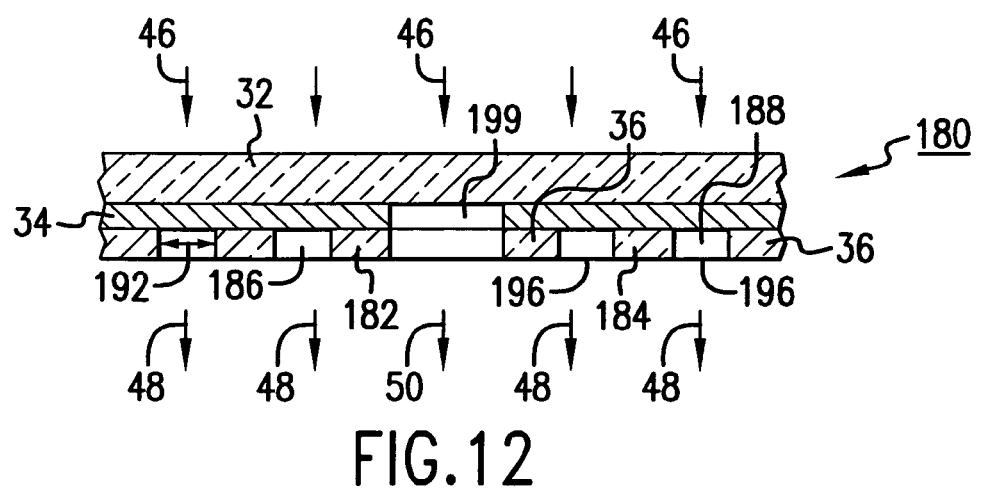
FIG. 12 is a cross-sectional view of the mask of FIG. 11, taken along the line 12—12.

The mask 180 shown in FIGS. 11 and 12 has nested opaque frames 182, 184 and nested, short bar, partially transmissive frames 186, 188. In the illustrated embodiment, the width (or separation distance) 190 of each opaque frame 182, 184 is about 0.12 μm, and the width 192 of each partially transmissive short bar 186, 188 is about 0.175 μm. The width 194 of each overlapping opaque corner 196 is likewise about 0.175 μm. The width 198 of the square opening 199 is about 0.14 μm. Thus, the small dimensions of the features patterned on the mask 180 are all less than the wavelength of the incident light 46.

Further, the layered structure 32, 34, 36 may be patterned to form a mask for forming an array of closely-spaced contact holes (or other features in the photoresist). The array may be regularly or asymmetrically configured. The contact holes may be cylindrical or elliptical, as discussed in more detail below.

Figure 14:
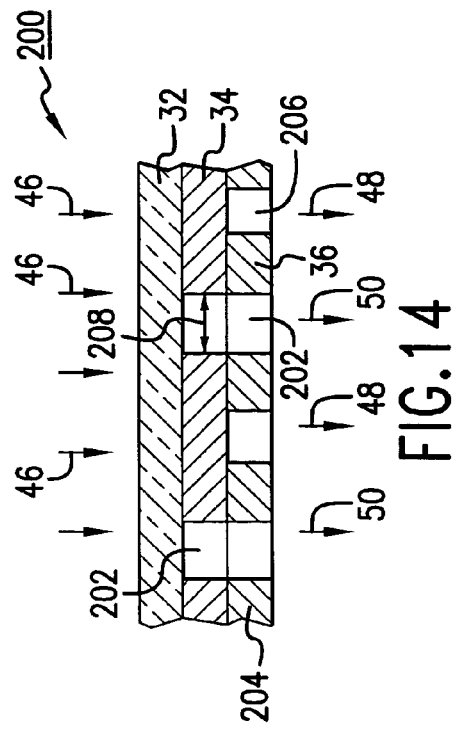
FIG. 14 is a cross-sectional view of the mask of FIG. 13, taken along the line 14—14.
Figure 15:
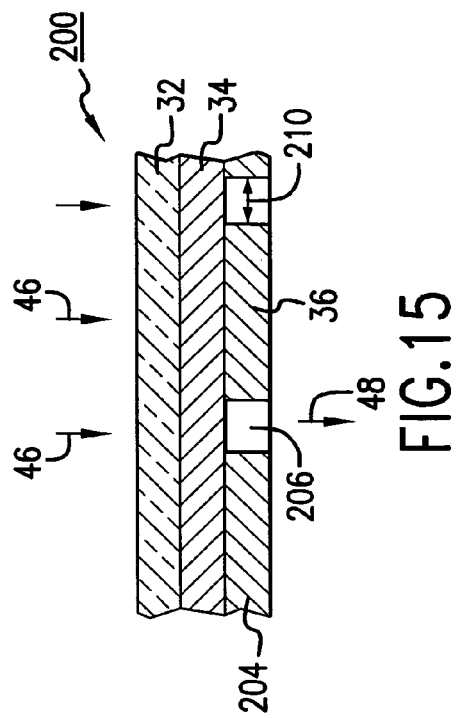
FIG. 15 is a cross-sectional view of the mask of FIG. 13, taken along the line 15—15.
Figure 13:
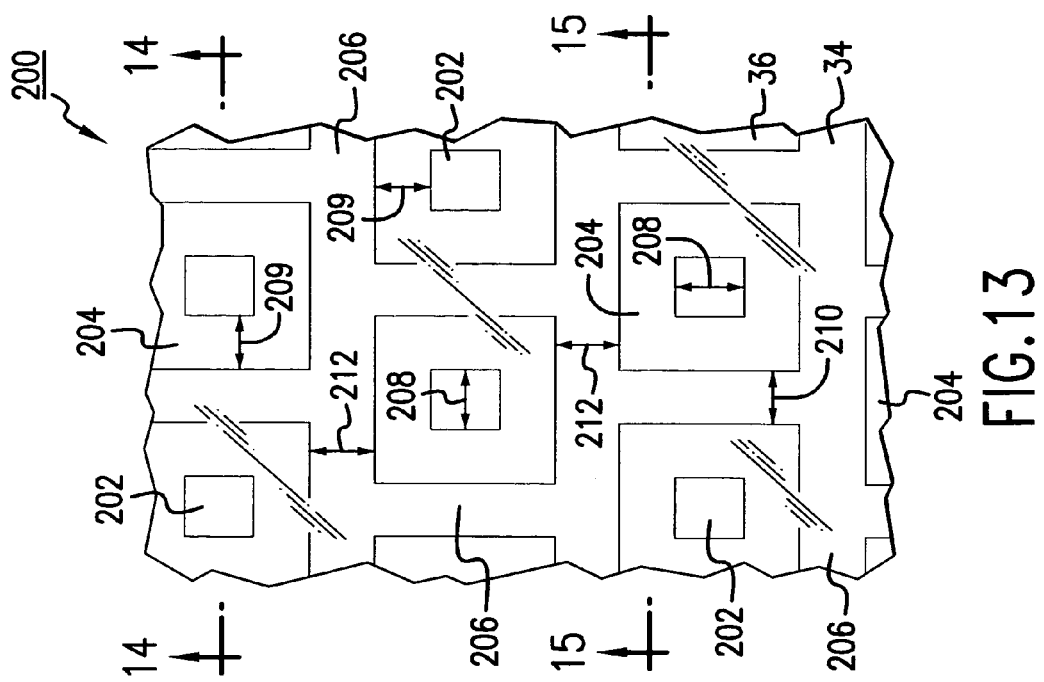
FIG. 13 is a plan view of another mask constructed in accordance with the invention.
Figure 16:
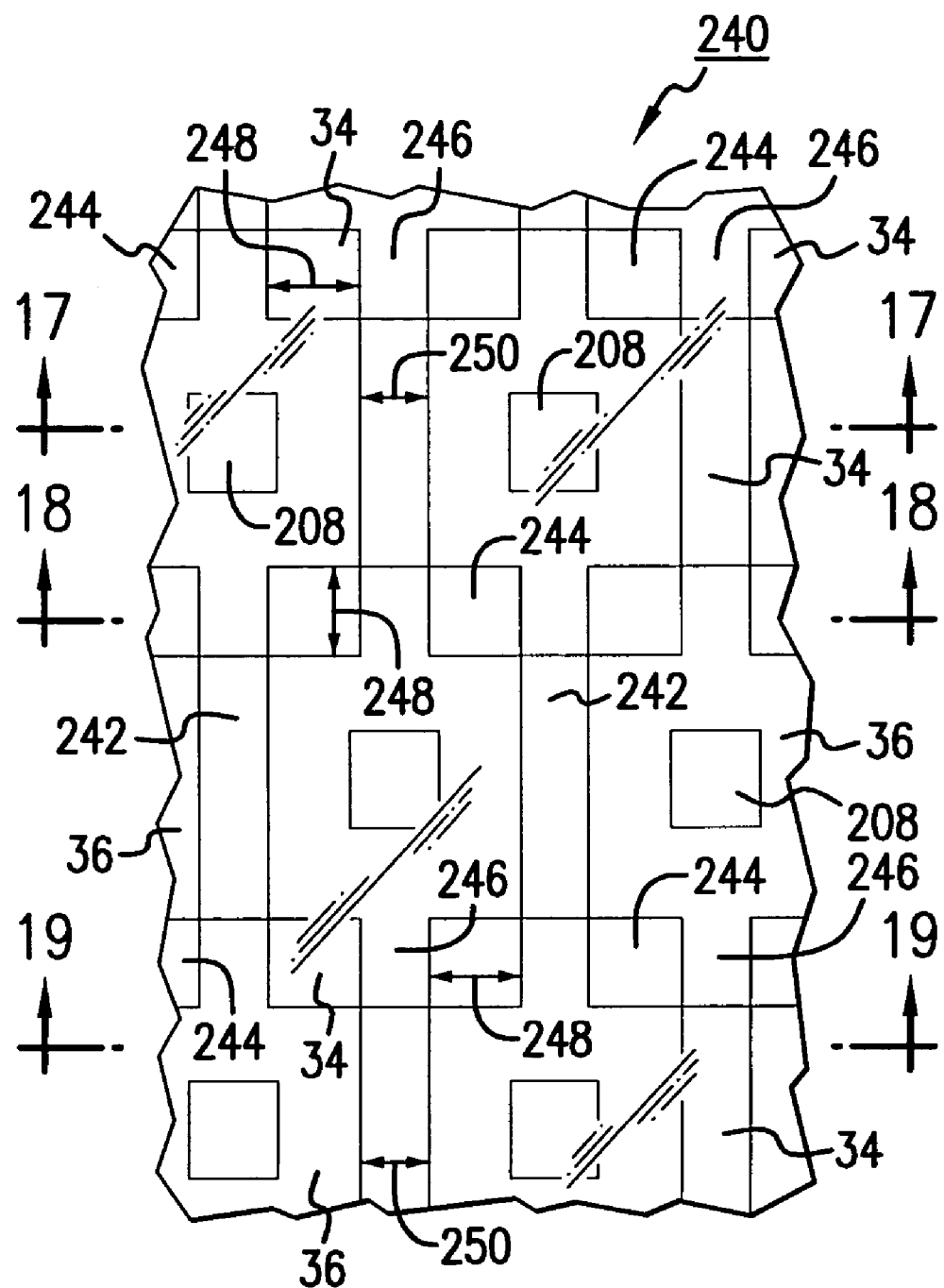
FIG. 16 is a plan view of another mask constructed in accordance with the invention.
Figure 17:
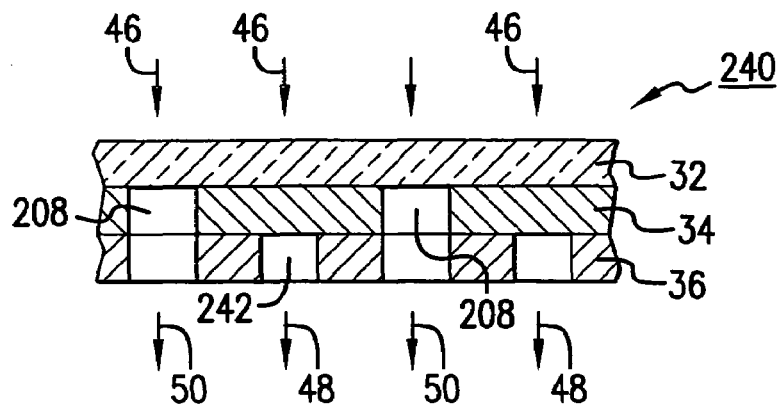
FIG. 17 is a cross-sectional view of the mask of FIG. 16, taken along the line 17—17.
Figure 18:
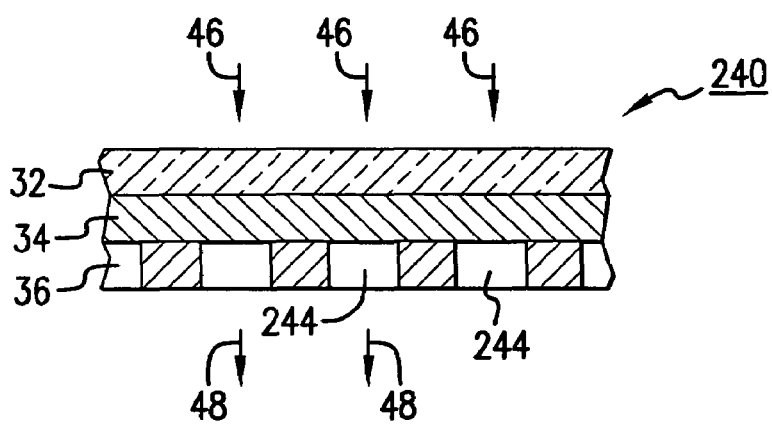
FIG. 18 is a cross-sectional view of the mask of FIG. 16, taken along the line 18—18.
Figure 19:
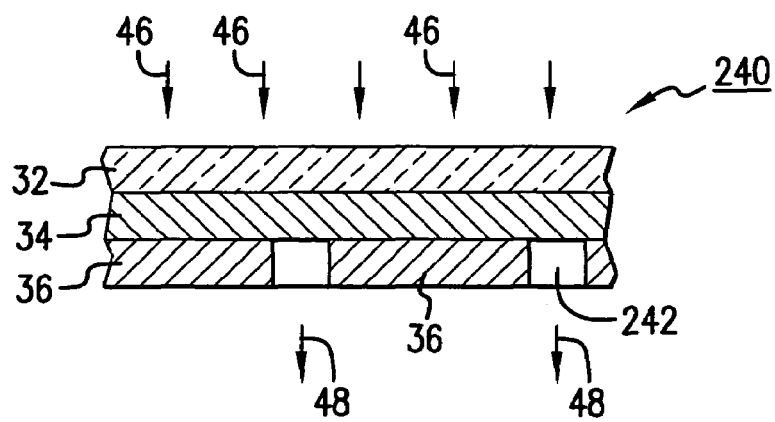
FIG. 19 is a cross-sectional view of the mask of FIG. 16, taken along the line 19—19.

FIGS. 13–25 show frame-based structures for forming arrays of contact holes. Referring now to FIGS. 13–15, there is shown a mask 200 for forming a regular array of contact holes, where each contact hole has a cylindrical CD of 0.12 μm, for example. The mask 200 is formed of a transparent substrate 32, an attenuating phase shift layer 34, and an opaque layer 36. The layers 32, 34, 36 may be formed of the same materials as described above in connection with FIGS. 1 and 2. The attenuating phase shift layer 34 and the opaque layer 36 are patterned to define square transparent openings 202, rectangular opaque frames 204 surrounding the openings 202, and partially transmissive/phase shifting outrigger bars 206. The partially transmissive outrigger bars 206 are connected to each other to define a regular array of outrigger frames around each opaque frame 204.

In operation, the mask 200 operates generally like the structure of FIGS. 1 and 2, except in a closely packed array. Incident light 46 (FIG. 14) is transmitted through the openings 202 and the outrigger frames 206, but is prevented from passing through the opaque material 204. The light that is transmitted through the outrigger frames 206 is phase-shifted (by 180° or an odd multiple thereof) and attenuated (to about 18%) relative to the light 46, 50 that is transmitted through the openings 202. The attenuated phase-shifted light 48 (FIG. 14) and the non-phase-shifted light 50 interact with each other to form the desired densely packed array of contact holes in the photoresist. The opaque frames 204 operate to separate the partially transmissive material 34, 206 from the square openings 202 to thereby provide the mask 200 with improved depth of focus (in the range of from about 0.4 to 0.8 μm or greater).

In the illustrated embodiment, the width 208 of the transparent openings 202 is about 0.15 μm. All of the small dimensions of the assist features 204, 206 are sub-resolution. The separation width 209 of the rectangular frames 204 is about 0.15 μm. The widths 210, 212 of the outrigger bars of the partially transmissive frame 206 are different from each other, and may be about 0.12 μm and about 0.14 μm in the respective orthogonal directions. As in the embodiments of FIGS. 1–12, the incident light 46 is propagated with a NA of about 0.63 and an on-axis illumination σ of about 0.35. As noted, however, the present invention should not be limited to the specific materials, dimensions and instrumentalities of the preferred embodiments shown and described in detail herein. In all of the embodiments described herein, the NA may be as high as 0.70 or more, and the σ value may be in the range of from about 0.3 to 0.85, for example. The invention may be operated with on-axis and off-axis illumination systems.

The mask 240 shown in FIGS. 16–19 is the same as the one shown in FIGS. 13–15, except that the partially transmissive outrigger frame for the mask 240 is formed of short bars 242, 244 that are separated at their ends. Opaque squares 246 are formed between the ends of the short bars 242, 244 to facilitate the design of the mask 240. The opaque squares 246 spatially and selectively limit the amount of phase-shifted light 48 (FIG. 17) that is exposed on the photoresist (not shown) to thereby control the formation of the contact holes with the desired geometries and with improved depth of focus. In the embodiment of FIGS. 16–19, the width 248 of each square portion 244 of the short bar frame is about 0.14 μm, and the width 250 of each elongated bar portion 242 of the short bar frame is about 0.12 μm. An advantage of the present invention is that the widths 248, 250 of the various cooperating assist features 244, 242 may be different from each other.

Figure 20:
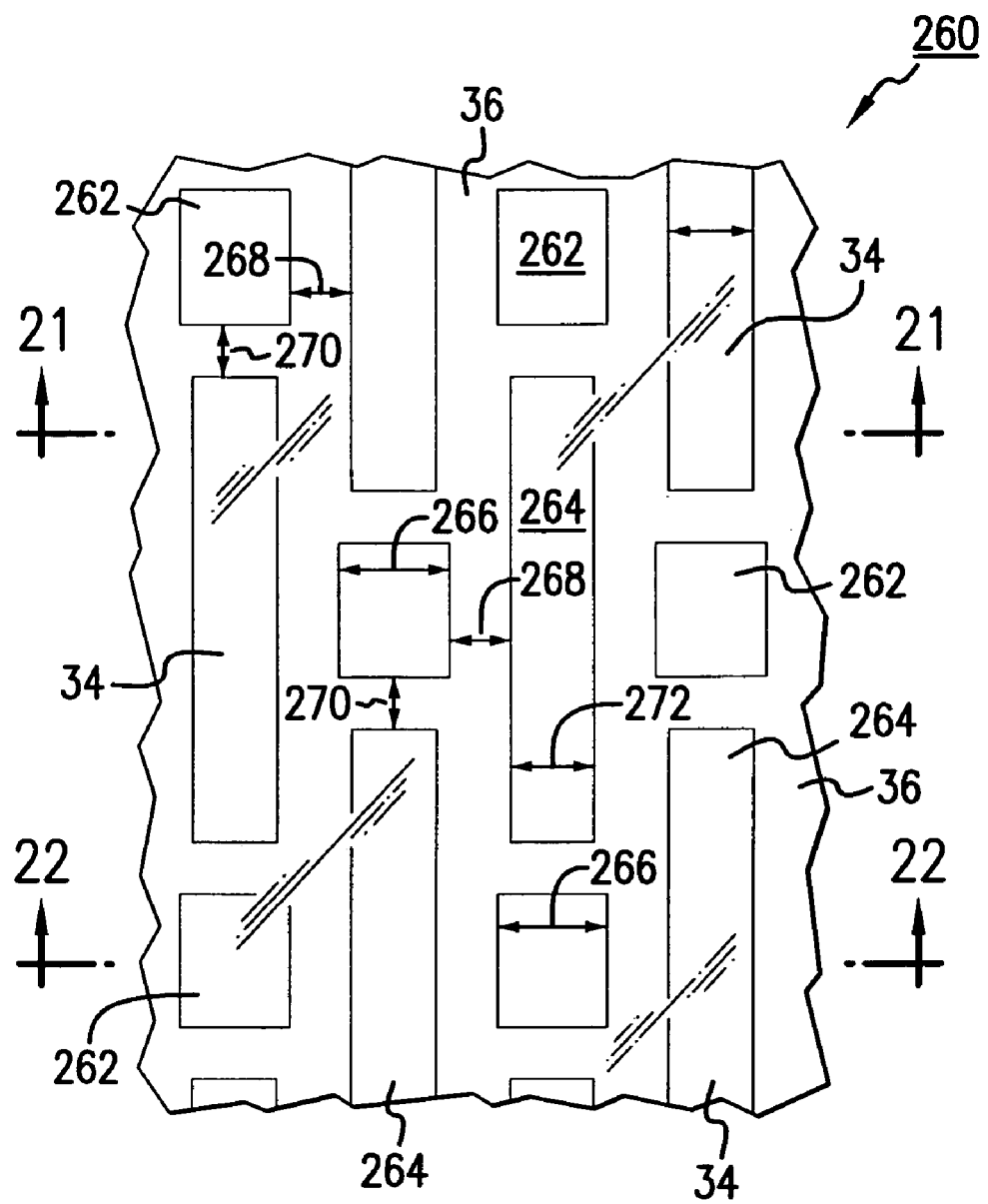
FIG. 20 is a plan view of another mask constructed in accordance with the invention.
Figure 21:
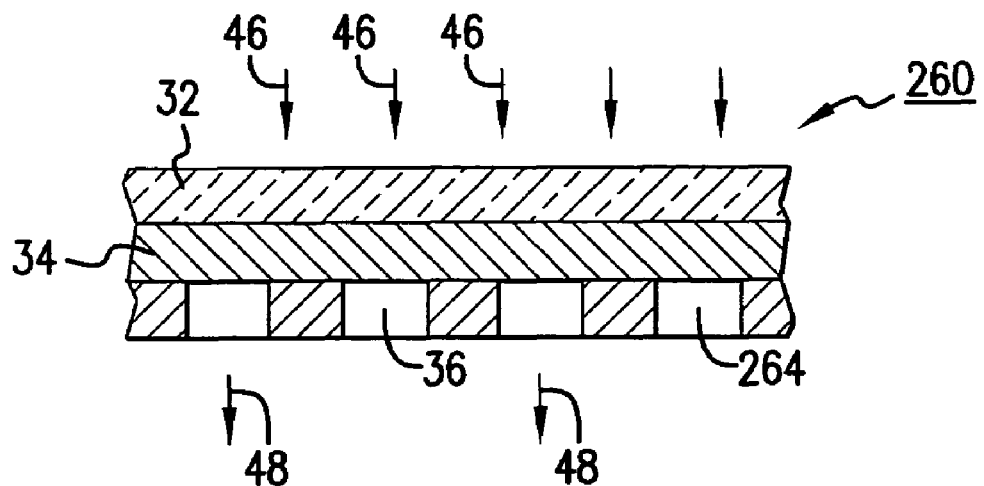
FIG. 21 is a cross-sectional view of the mask of FIG. 20, taken along the line 21—21.
Figure 22:
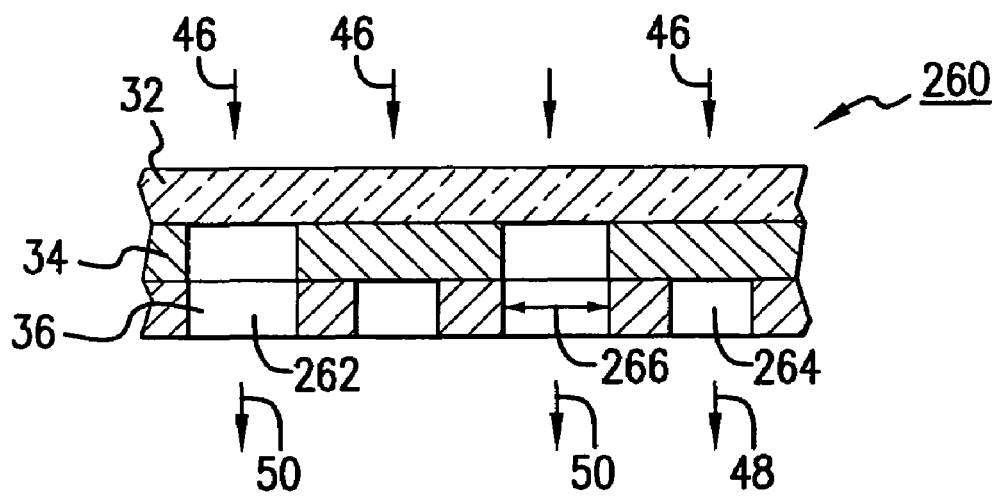
FIG. 22 is a cross-sectional view of the mask of FIG. 20, taken along the line 22—22.

FIGS. 20–22 show a mask 260 for forming an asymmetric array of cylindrical contact holes (not shown). The contact holes are aligned with transparent openings 262 patterned through the opaque layer 36 and the partially transmissive layer 34. The opaque layer 36 is further patterned to expose bar-shaped regions 264 of the partially transmissive material 34. The opaque material 36 that remains between the openings 262 and the partially transmissive bars 264 operate like opaque frames of the type shown in FIGS. 1 and 2. The dimensions of the asymmetric mask 260 may be as follows: The width 266 of the square openings 262 may be about 0.19 μm. The separation widths 268, 270 of the opaque rectangular frames 36 may be about 0.21 and 0.19 μm, respectively. The width 272 of the elongated partially transmissive bars 264 may be about 0.15 μm.

In an alternative embodiment of the invention (not shown), the patterned layers of the mask 260 may be patterned in an inverse fashion such that the partially transmissive material 34 is contiguous with the transparent openings 262, and bounded by longitudinal bars of opaque material 36. In this alternative embodiment of the invention, the incident light 46 is transmitted (50) through the openings 262 without any phase-shifting or attenuation. The incident light 46 is blocked entirely by longitudinal, parallel bars of opaque material 36, and the rest of the incident light 46 (48) is attenuated and phase-shifted by assist frames that surround the transparent openings 262.

Figure 23:
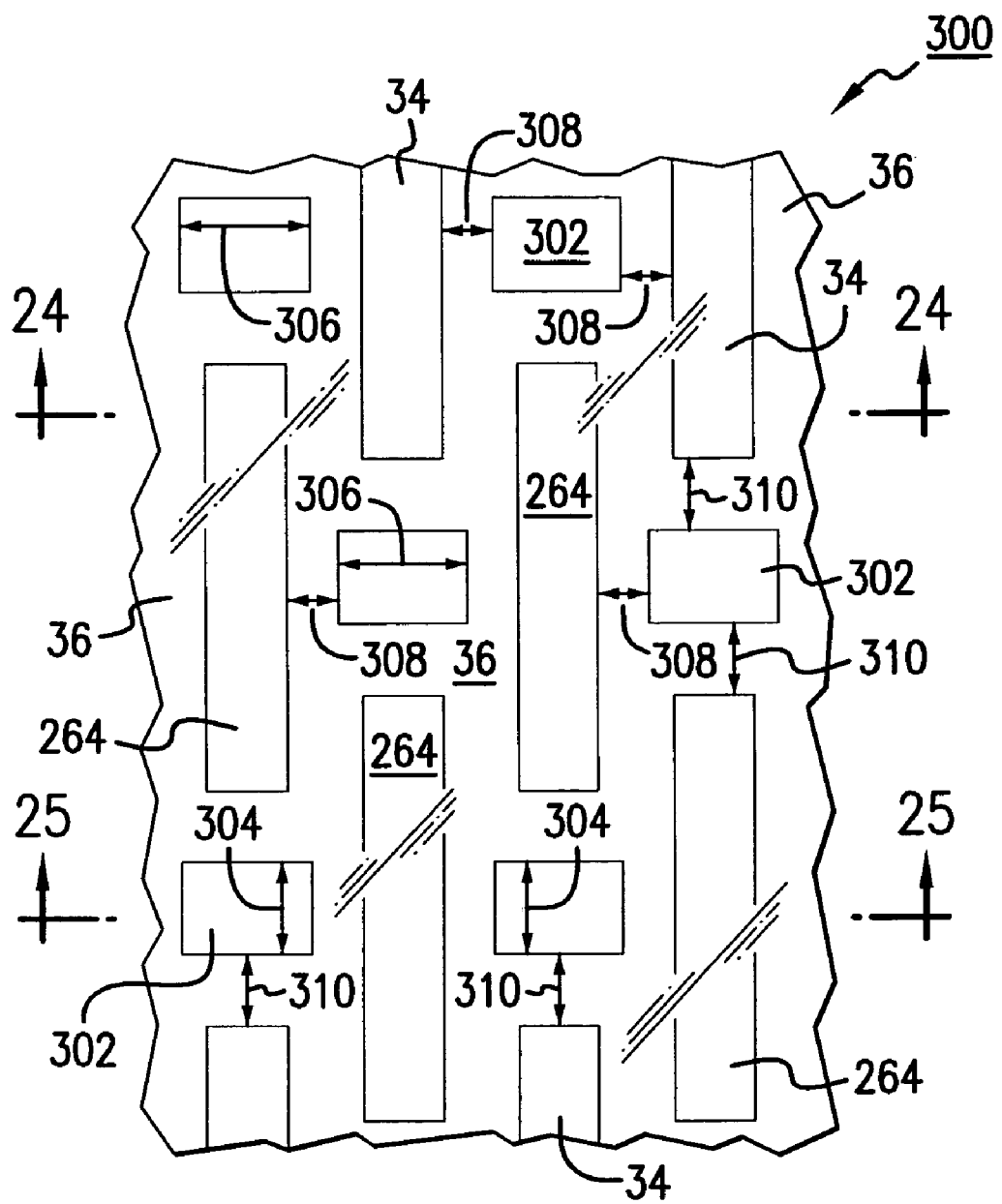
FIG. 23 is a plan view of another mask constructed in accordance with the invention.
Figure 24:
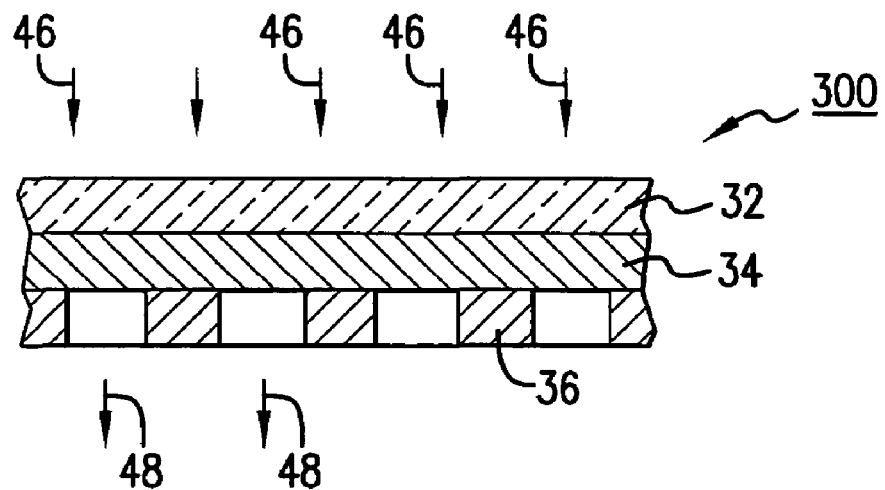
FIG. 24 is a cross-sectional view of the mask of FIG. 23, taken along the line 24—24.
Figure 25:
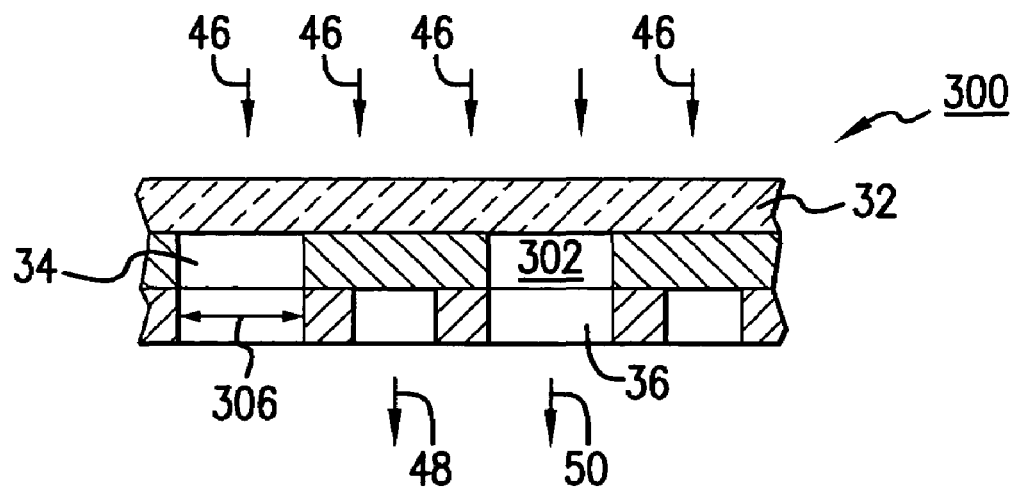
FIG. 25 is a cross-sectional view of the mask of FIG. 23, taken along the line 25—25.

FIGS. 23–25 show a mask 300 for forming an array of elliptical holes. The mask 300 of the FIGS. 23–25 embodiment is like the mask 260 shown in FIGS. 20–22 except that the transparent openings 302 are rectangular and not square. In the FIGS. 23–25 embodiment, the width 304 and length 306 of the openings 302 may be about 0.15 and 0.23 μm, respectively. The separation widths 308, 310 of the opaque rectangular frames 36 may be different from each other, and the length and width of the partially transmissive bars may be about 0.14 μm and 0.70 μm, respectively.

Figure 26:
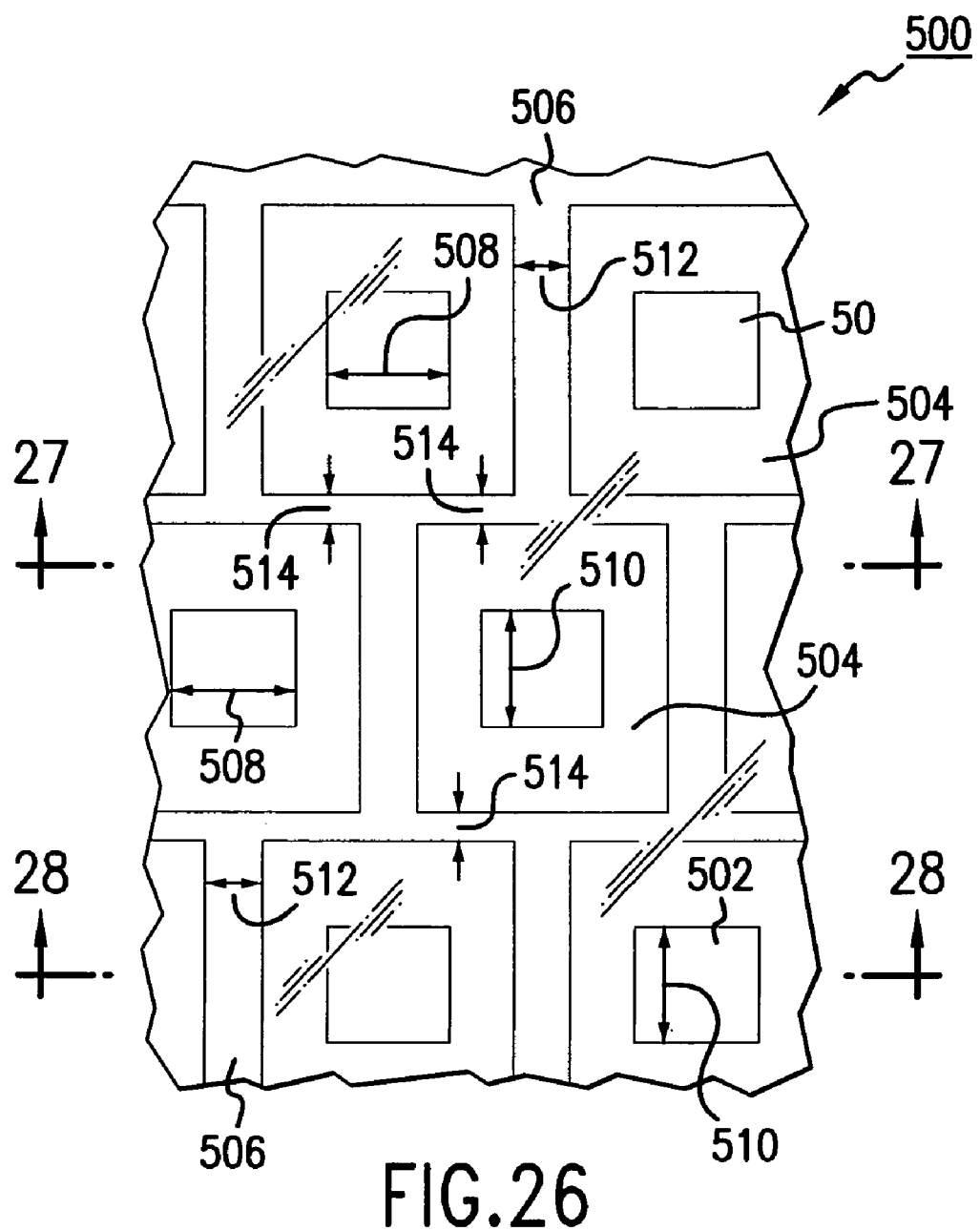
FIG. 26 is a plan view of another mask constructed in accordance with the invention.
Figure 27:
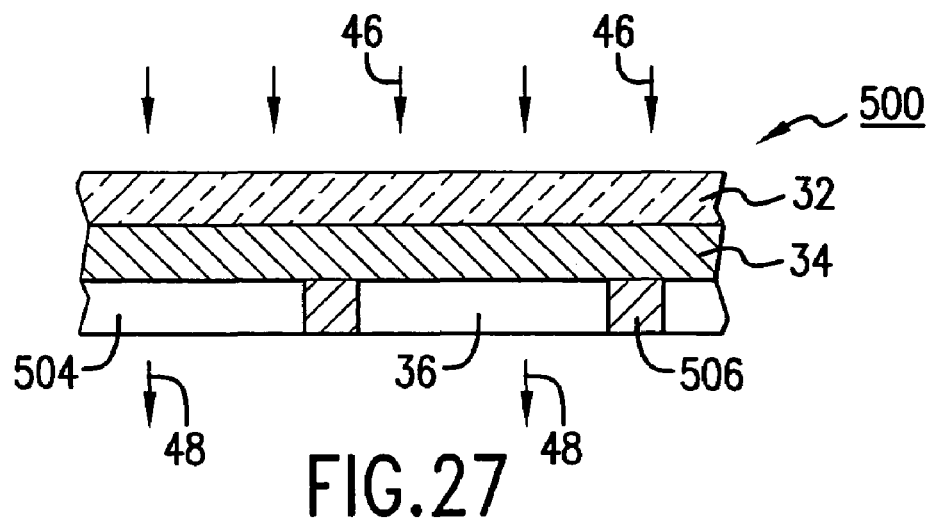
FIG. 27 is a cross-sectional view of the mask of FIG. 26, taken along the line 27—27.
Figure 28:
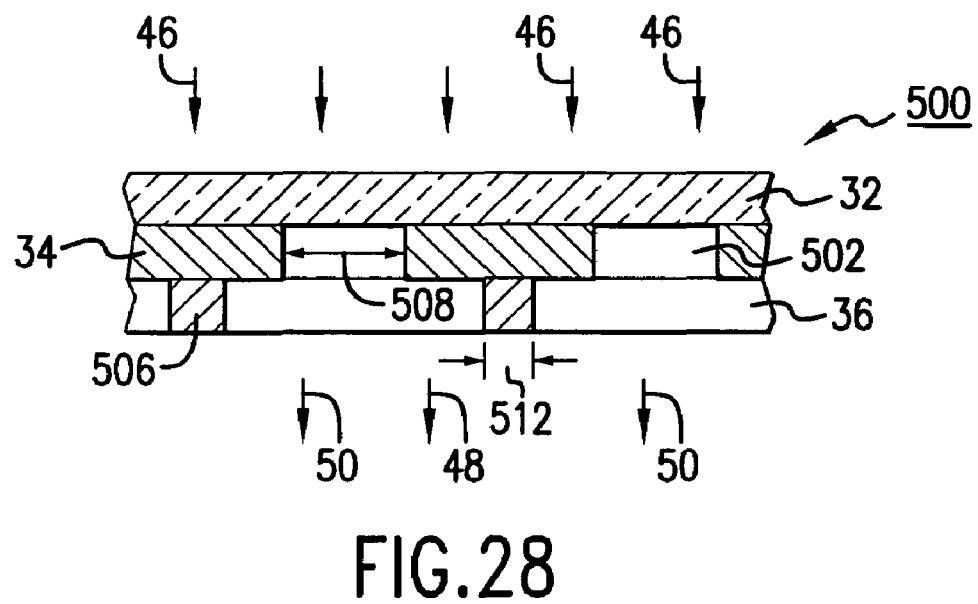
FIG. 28 is a cross-sectional view of the mask of FIG. 26, taken along the line 28—28.

FIGS. 26–34 show rim-based structures for forming arrays of contact holes. Referring now to FIGS. 26–28, there is shown a microlithographic mask 500 for forming a regular array of contact holes (not shown) in photoresist (not shown). The mask 500 is formed of a transparent substrate 32 (FIG. 27), an attenuating phase shift layer 34, and an opaque layer 36. The attenuating phase shift layer 34 and the opaque layer 36 are patterned to define rectangular transparent openings 502, partially transmissive rims 504, and an opaque background 506.

In the structure shown in FIG. 26, the width and length of the opaque bars 36 between contacts 502 limit the size of the rims 504. In an alternative embodiment of the invention, the bars surrounding the rims 504 may be non-opaque, but of another transmission. Whether the bars are opaque, light-obstructing, or transparent, they can still contribute to the function of defining the image.

In operation, incident light 46 (FIG. 27) is transmitted through the openings 502 and the rims 504. The incident light 46 may be generated by a suitable source (not shown) located above the mask 500. The incident light 46 is prevented from passing through the opaque material 506. The light 46, 48 that is transmitted through the rims 504 is phase-shifted (by 180° or an odd multiple thereof) relative to the light 46, 50 that is transmitted through the transparent openings 502. In addition, the rims 504 attenuate the phase-shifted light 48 relative to the non-phase-shifted light 50. The attenuated phase-shifted light 48 interacts with the non-phase-shifted light 50 to form the desired contact holes.

In the illustrated embodiment, the partially transmissive rims 504 cooperate with the square openings 502 to form the contact holes with minimal side lobing and improved depth of focus. In a preferred embodiment, the cylindrical contact hole may be formed with a depth of focus of about 0.8 μm or greater. As in the embodiments discussed above, the depth of focus determines the length of the cylindrical hole that can be formed in the photoresist without unacceptable side-lobing. The depth of focus also characterizes the ability of the mask 500 to be used to form sub-resolution features in non-flat photoresist surfaces.

In the illustrated embodiment, the substrate 32 is formed of quartz, the attenuating phase shift layer 34 is formed of MoSi, and the opaque layer 36 is formed of chrome. The transmissivity of the attenuating phase shift layer 34 may be about 18% when the wavelength of the incident light is about 248 nm. The transmissivity of the transparent quartz layer 32 may be essentially 100%. Other suitable materials may be employed in the mask 500, and additional layers may be provided, if desired.

Further, the orthogonal dimensions 508, 510 of each transparent opening 502 are about 0.22 μm and 0.20 μm, respectively. The diameter of each hole (not shown) formed by the mask 500 is about 0.12 μm (less than the wavelength of the incident light 46) in the exposed photoresist. The widths 512, 514 of the opaque bars 506 are about 0.10 μm and 0.06 μm, respectively. The incident light 46 is propagated with a numerical aperture (NA) of about 0.63 and a sigma (σ) of about 0.35. The thickness of the three layers 36, 34, 32 may be 700 to 1000 Angstroms, 800 to 1200 Angstroms, and one-quarter inch, respectively. The present invention should not be limited, however, to the specific materials, dimensions and instrumentalities of the preferred embodiments shown and described in detail herein.

Figure 29:
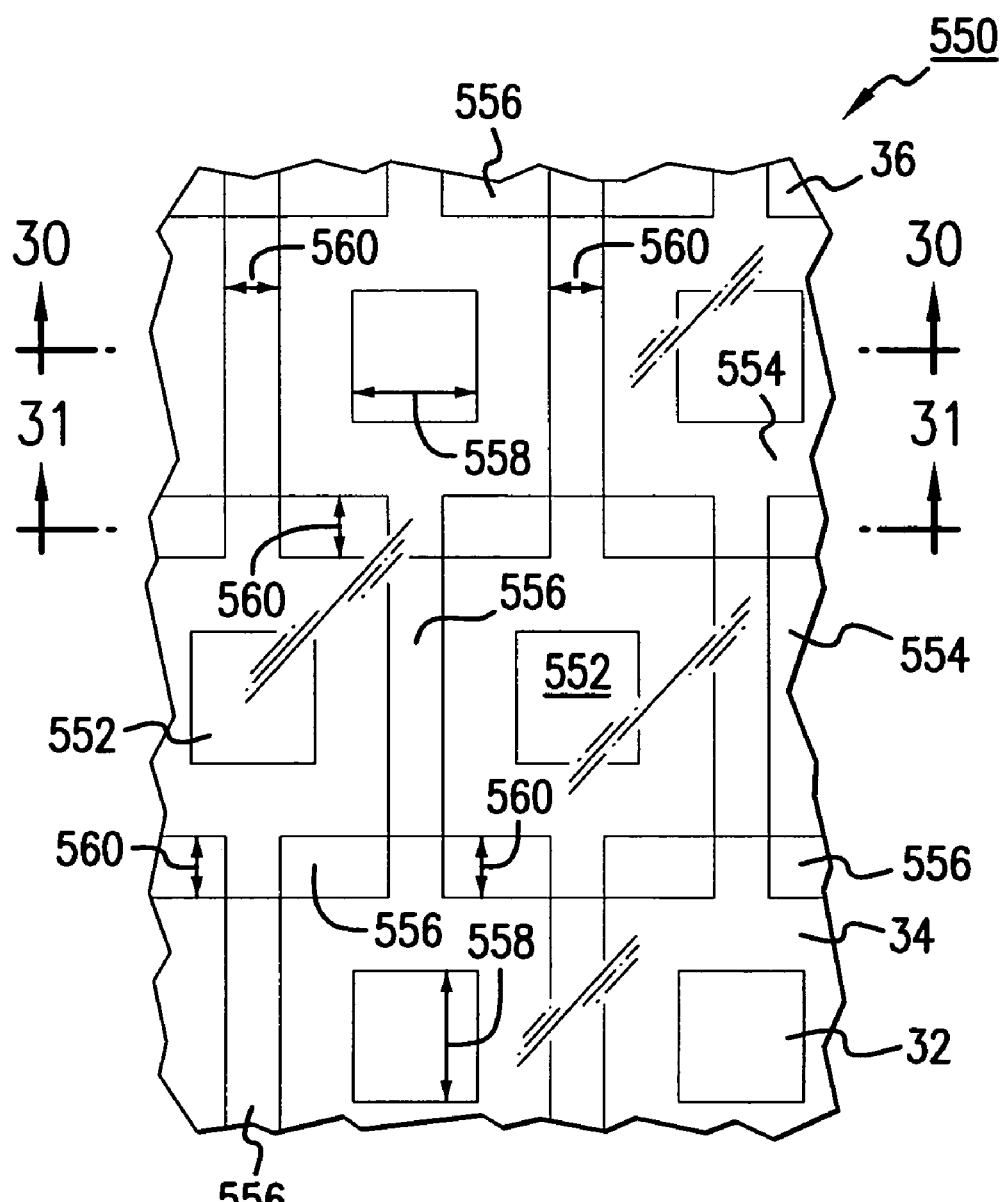
FIG. 29 is a plan view of another mask constructed in accordance with the invention.
Figure 30:
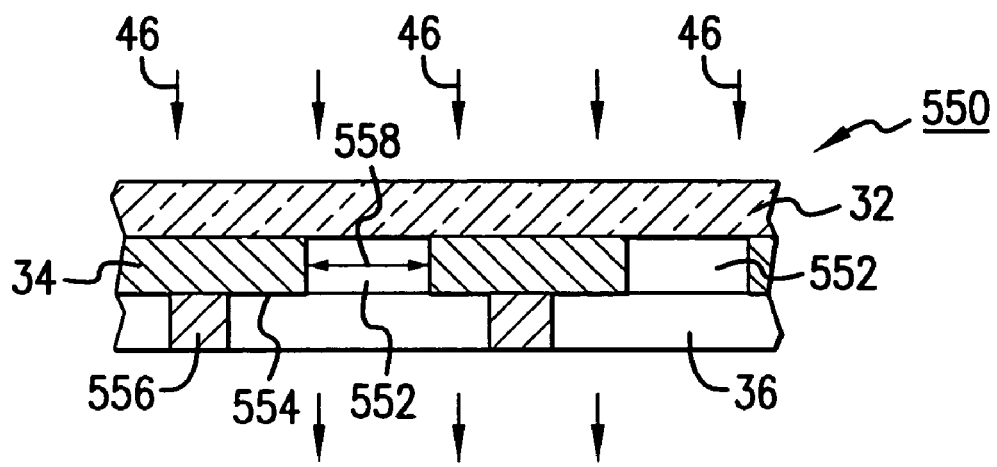
FIG. 30 is a cross-sectional view of the mask of FIG. 29, taken along the line 30—30.
Figure 31:
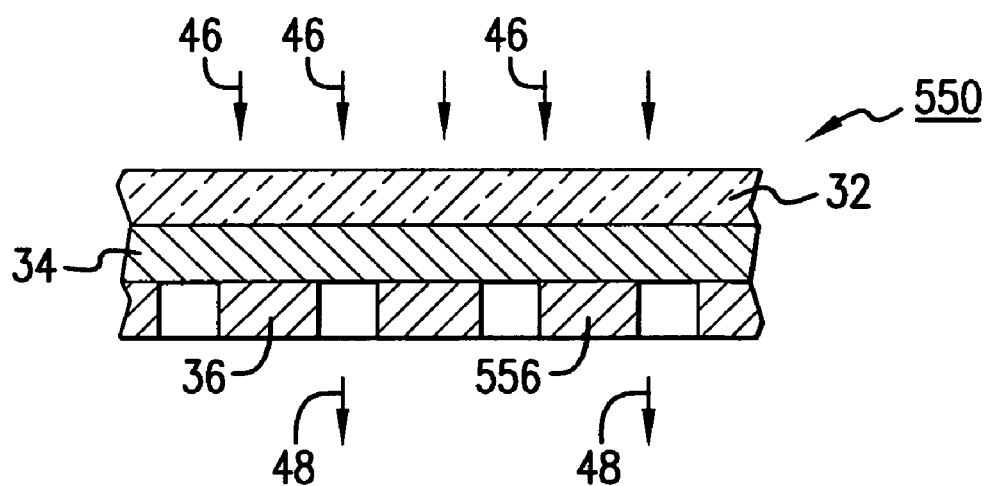
FIG. 31 is a cross-sectional view of the mask of FIG. 29, taken along the line 31—31.

FIGS. 29–31 show another microlithographic mask 550 for forming a regular array of contact holes in photoresist (not shown). The mask 550 is formed of a transparent substrate 32 (FIG. 30), an attenuating phase shift layer 34, and an opaque layer 36. The three layers 32, 34, 36 may be formed of the same materials and with the same thicknesses as described above in connection with the mask 500 of FIGS. 26–28. Alternatively, other suitable materials may be employed in the mask 550, and additional layers may be provided, if desired.

In the FIGS. 29–31 embodiment, the attenuating phase shift layer 34 and the opaque layer 36 are patterned to define square transparent openings 552, partially transmissive rims 554, and an opaque background formed of short bars 556. In operation, incident light 46 is transmitted through the openings 552 and the rims 554. The incident light 46 is prevented from passing through the opaque bars 556. The light 46, 48 that is transmitted through the rims 554 is phase-shifted (by 180° or an odd multiple thereof) relative to the light 46, 50 that is transmitted through the transparent openings 552. In addition, the rims 554 attenuate the phase-shifted light 48 relative to the non-phase-shifted light 50. The attenuated phase-shifted light 48 interacts with the non-phase-shifted light 50 to form the desired array of contact holes with minimal side lobing and improved depth of focus.

The width 558 of each transparent opening 552 is about 0.21 µm. The diameter of each hole (not shown) formed by the mask 550 is about 0.12 µm in the exposed photoresist. The width 560 of each short opaque bar 556 is about 0.10 µm. The incident light 46 may be propagated with a numerical aperture (NA) of about 0.63 and a sigma (σ) of about 0.35 inch. The present invention should not be limited, however, to the specific materials and dimensions shown and described in detail herein. The scope of the invention should be determined according to the appended claims.

Figure 32:
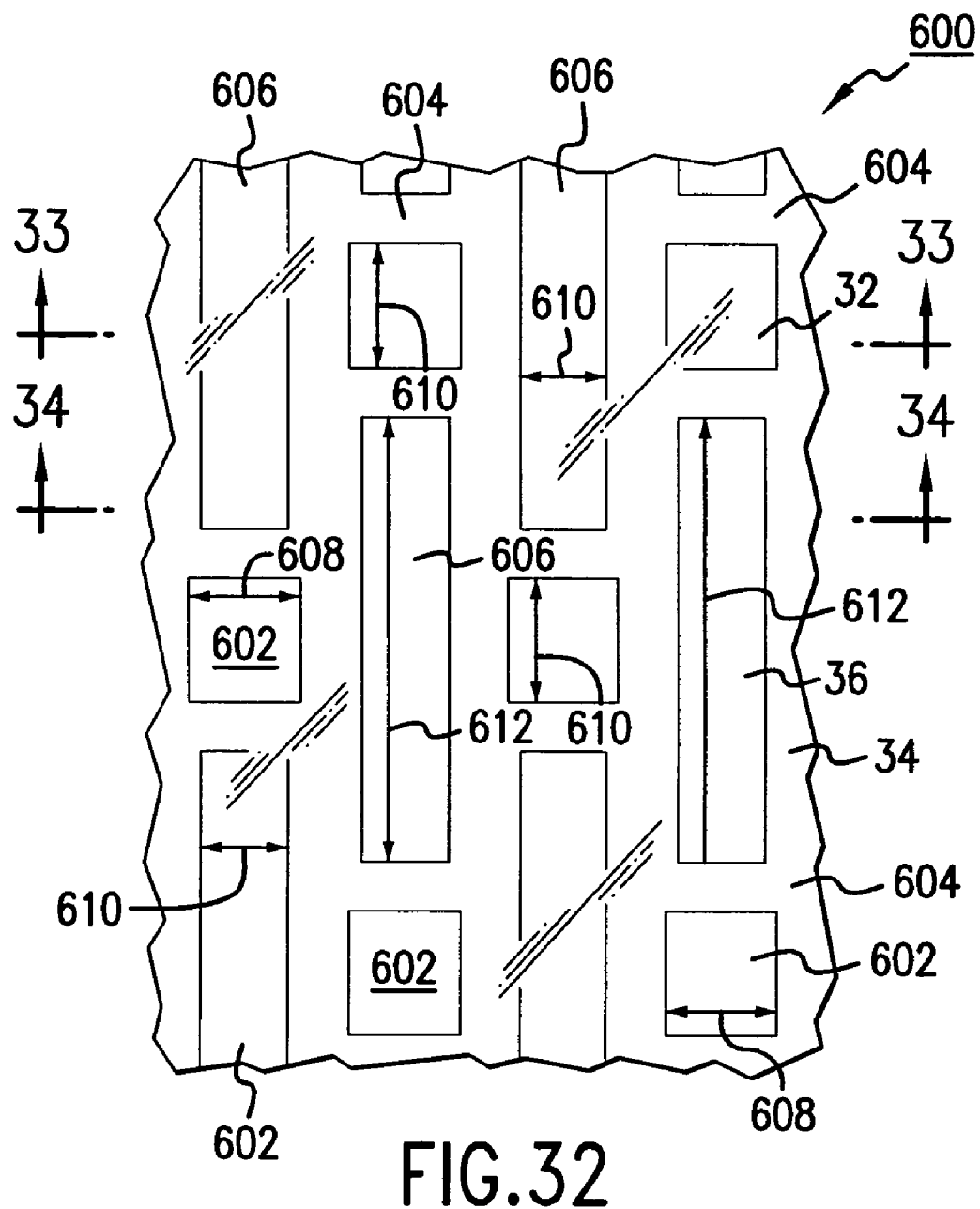
FIG. 32 is a plan view of another mask constructed in accordance with the invention.
Figure 33:
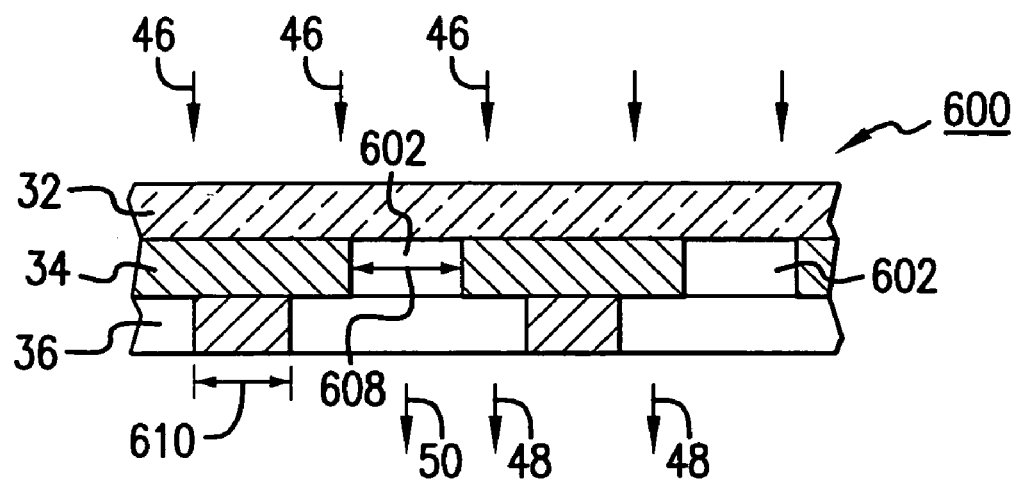
FIG. 33 is a cross-sectional view of the mask of FIG. 32, taken along the line 33—33.
Figure 34:
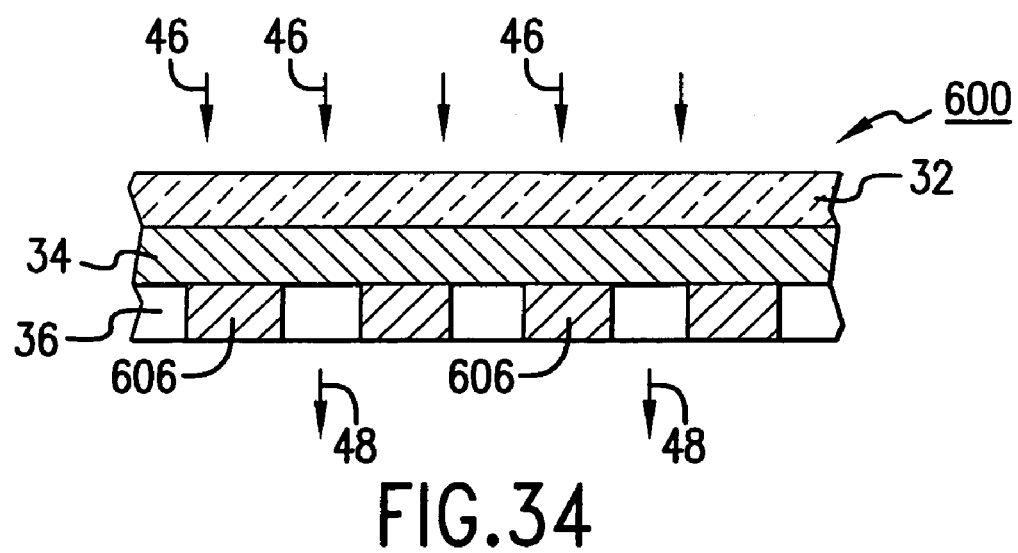
FIG. 34 is a cross-sectional view of the mask of FIG. 32, taken along the line 34—34.

FIG. 32 shows another microlithographic mask 600 for forming a regular array of contact holes in photoresist. As shown in FIGS. 33 and 34, the illustrated mask 600 is formed of a transparent substrate 32, an attenuating phase shift layer 34, and an opaque layer 36. The three layers 32, 34, 36 may be formed of the same materials and with the same thicknesses as described above in connection with the mask 500 of FIGS. 26–28. The attenuating phase shift layer 34 and the opaque layer 36 are patterned to define rectangular transparent openings 602, partially transmissive, asymmetric rims 604, and an opaque background formed of long bars 606. The parallel bars 606 are staggered with respect to the openings 602. In operation, incident light 46 is transmitted through the openings 602 and the asymmetric rims 604.

The incident light 46 is prevented from passing through the opaque bars 606. The light 46, 48 that is transmitted through the rims 604 is phase-shifted (by 180° or an odd multiple thereof) relative to the light 46, 50 that is transmitted through the transparent openings 602. In addition, the rims 604 attenuate the phase-shifted light 48 relative to the non-phase-shifted light 50. The attenuated phase-shifted light 48 interacts with the non-phase-shifted light 50 to form the desired array of closely packed contact holes with minimal side lobing and improved depth of focus.

In the illustrated embodiment, the orthogonal dimensions 608, 610 of each transparent opening 602 are about 0.19 µm and 0.21 µm, respectively. The diameter of each hole (not shown) formed by the mask 500 is about 0.12 µm in the exposed photoresist, where the propagation characteristics of the incident light are as follows: NA=about 0.63; and σ=about 0.35. To define the desired asymmetric rims 604, each long opaque bar may have a width 610 of about 0.15 µm and a length 612 of about 0.72 µm. The dimensions may be calculated by a suitable programmed computer as discussed in more detail below.

Figure 35:
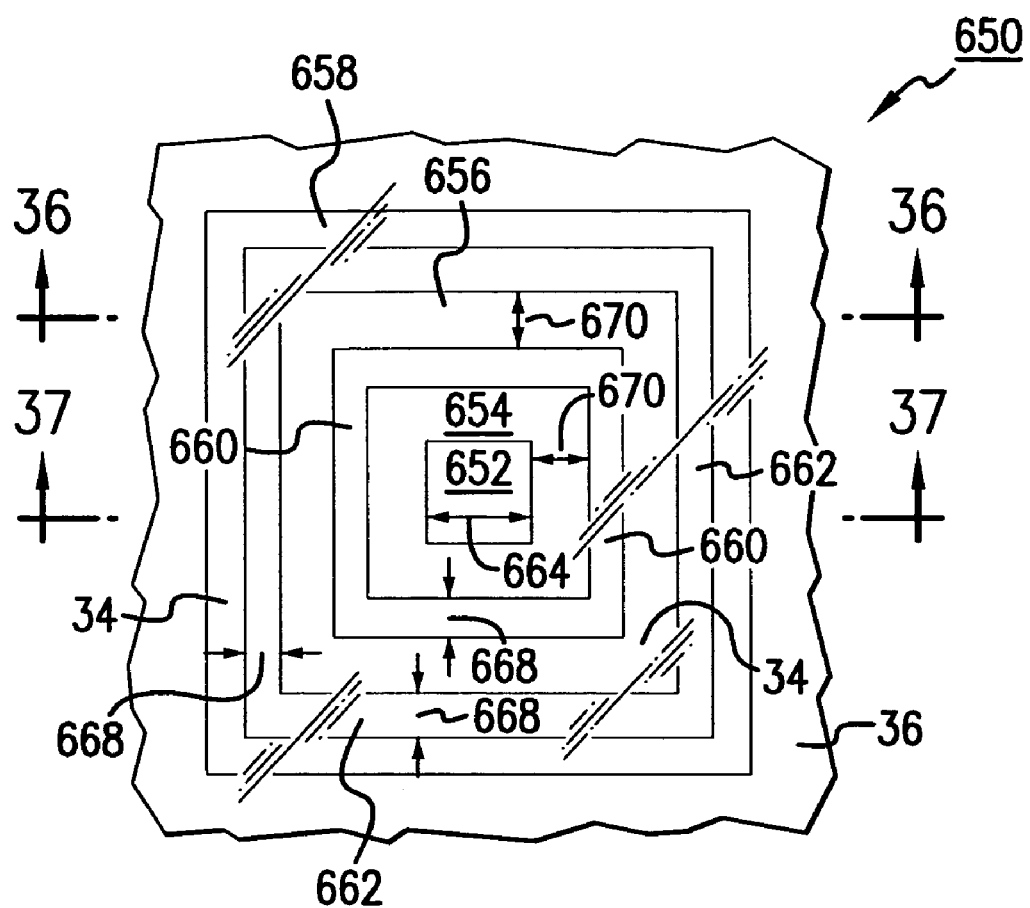
FIG. 35 is a plan view of another mask constructed in accordance with the invention.
Figure 36:
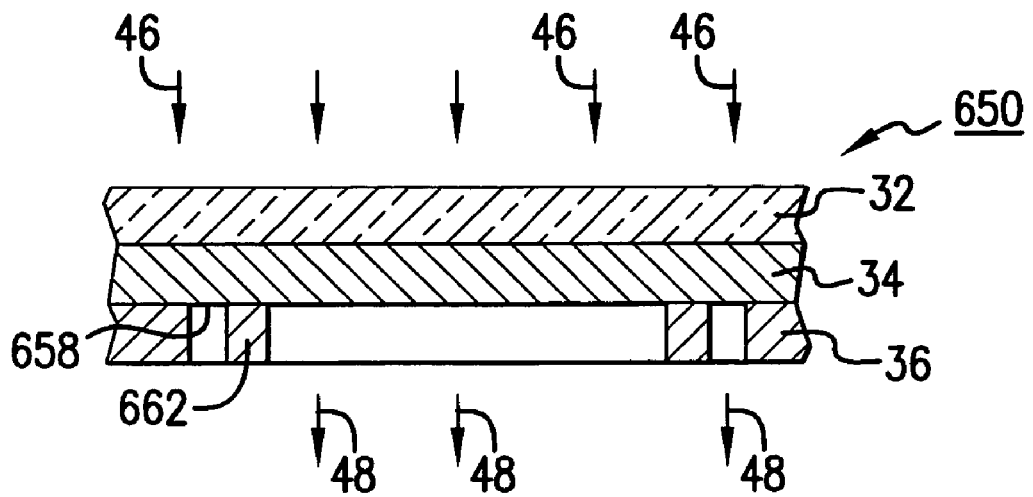
FIG. 36 is a cross-sectional view of the mask of FIG. 35, taken along the line 36—36.
Figure 37:
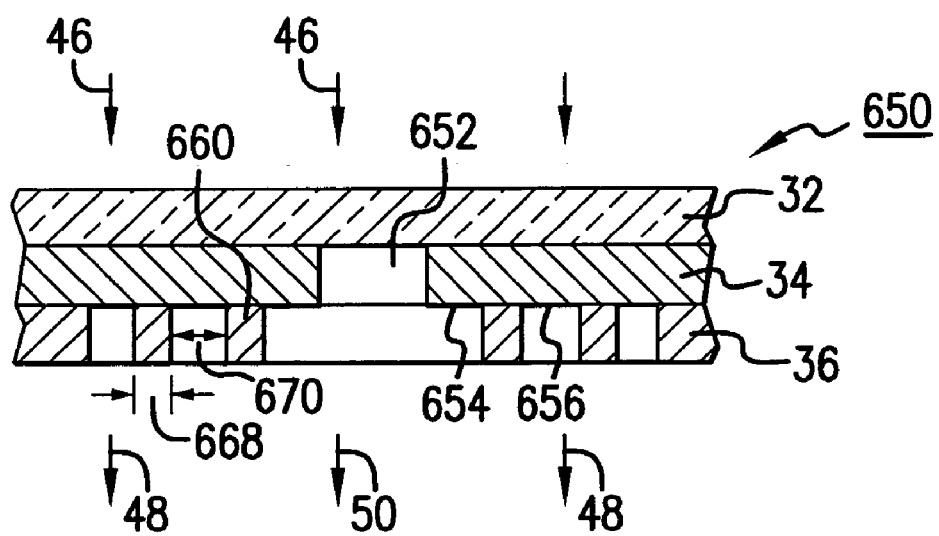
FIG. 37 is a cross-sectional view of the mask of FIG. 35, taken along the line 37—37.

FIGS. 35–46 show additional rim-based structures for forming isolated contacts. Thus, FIG. 35 shows a microlithographic mask 650 for forming an isolated contact hole in photoresist. As shown in FIGS. 36 and 37, the mask 650 includes a transparent substrate 32, an attenuating phase shift layer 34, and an opaque layer 36. The three layers 32, 34, 36 may be formed of the same materials and with the same thicknesses as described above in connection with the mask 500 of FIGS. 26–28. The attenuating phase shift layer 34 and the opaque layer 36 are patterned to a square transparent opening 652 enclosed within concentric partially transmissive frames 654, 656, 658. The partially transmissive assist features 654–658 are defined by a double set of long, orthogonal, opaque bars 660, 662, and an outer opaque background 664.

In operation, incident light 46 is transmitted through the isolated opening 652 and the concentric rims 654–658. The incident light 46 is prevented from passing through the opaque frames 660, 662. The light 46, 48 that is transmitted through the rims 654–658 is phase-shifted (by 180° or an odd multiple thereof) relative to the light 46, 50 that is transmitted through the transparent opening 652. The rims 654–658 attenuate the phase-shifted light 48 relative to the non-attenuated light 50. The light 48, 50 interacts to form the desired contact hole with minimal side lobing and improved depth of focus.

In the illustrated embodiment, the width 664 of the opening 652 is about 0.20 µm to form a 0.12 µm diameter hole in the exposed photoresist, where the propagation characteristics of the incident light 46 are as follows: NA=about 0.63; and σ=about 0.35. The width 668 of each long bar frame 660, 662 may be about 0.07 µm. If desired, the separation distances 670 between the opaque assist features may be about 0.1 µm.

Figure 38:
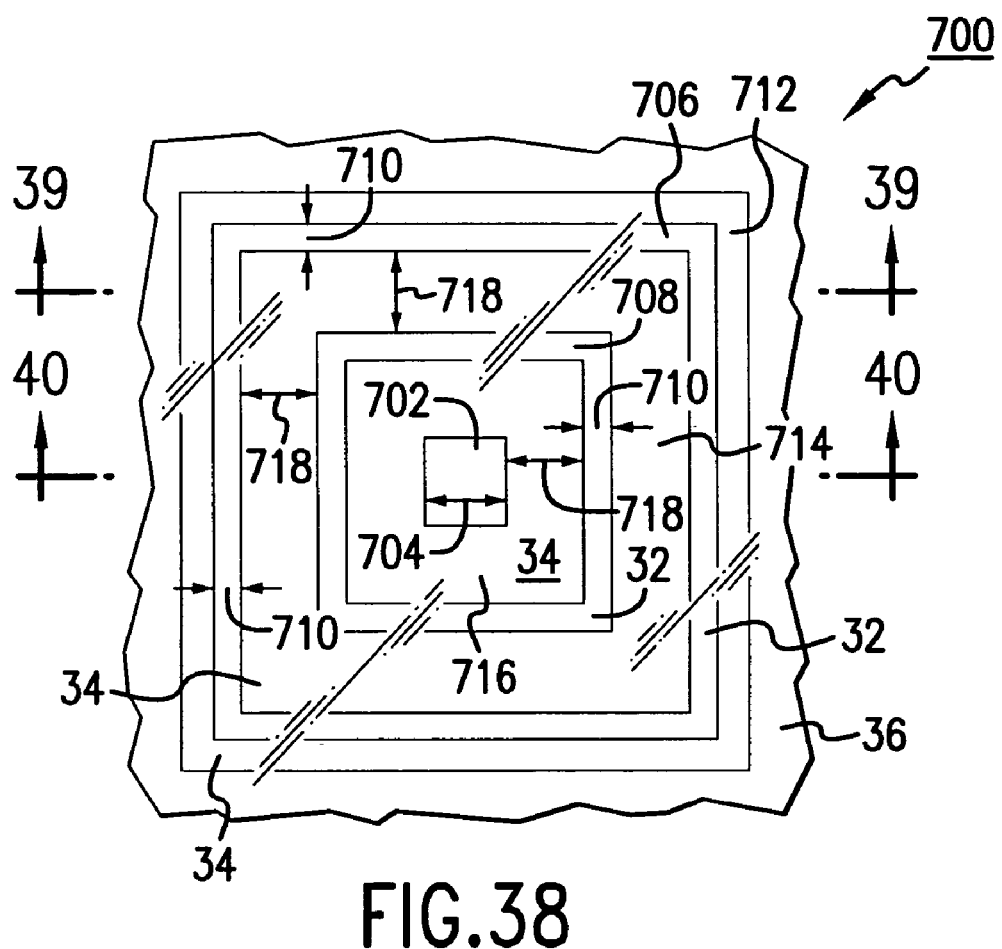
FIG. 38 is a plan view of another mask constructed in accordance with the invention.
Figure 39:
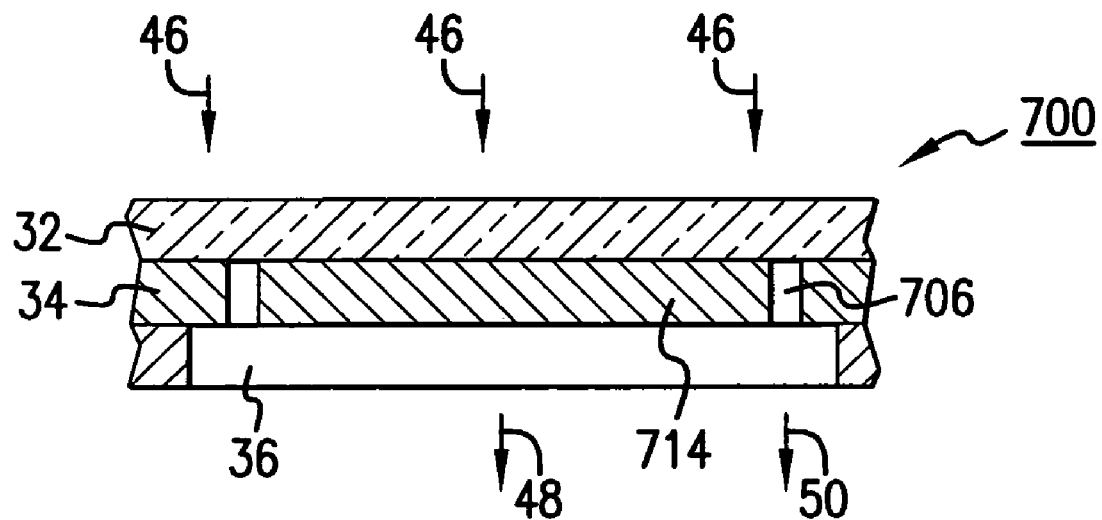
FIG. 39 is a cross-sectional view of the mask of FIG. 38, taken along the line 39—39.
Figure 40:
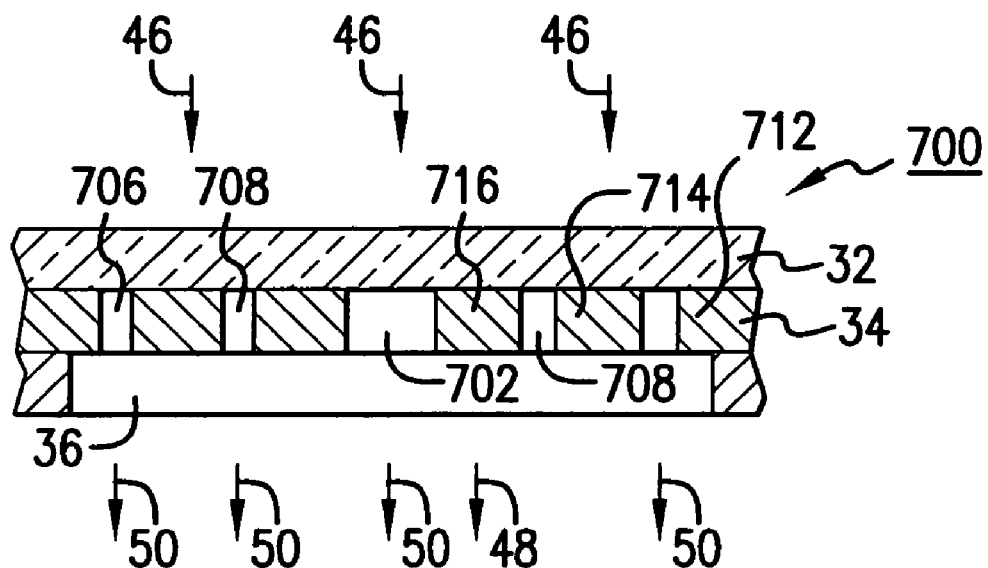
FIG. 40 is a cross-sectional view of the mask of FIG. 38, taken along the line 40—40.

FIGS. 38–40 show a microlithographic mask 700 with a rim that includes double transparent long bars. The mask 700 may be used to form an isolated contact hole in photoresist. Like the masks discussed above, the mask 700 of FIGS. 38–40 is formed of a transparent substrate 32, an attenuating phase shift layer 34, and an opaque layer 36. As shown in FIG. 38, the attenuating phase shift layer 34 is patterned to form a square transparent opening 702 (width 704=about 0.22 µm) and concentric transparent frames 706, 708 (width 710=about 0.08 µm). The opening 702 is surrounded by the transparent frames 706, 708. The partially transmissive material 34 on opposite sides of the rims 706, 708 forms phase-shifting assist features 712, 714, 716. The assist features 712–716 (separation distance 718=about 0.2 µm) may be concentrically, alternatingly nested with the transparent frames 706, 708. The outermost assist feature 712 may be surrounded by the opaque background 36.

In operation, incident light 46 (NA=about 0.63; σ=about 0.35) is transmitted through the isolated opening 702, the transparent frames 706, 708 and the rim shaped assist features 712–716. The light 46, 48 that is transmitted through the concentric rims 712–716 is phase-shifted (by 180° or an odd multiple thereof) and attenuated relative to the light 46, 50 that is transmitted through the transparent opening 702 and the frames 706, 708. Thus, the transmitted light 48, 50 interacts to form the desired contact hole (not shown; diameter=about 0.12 µm) with minimal side lobing and improved depth of focus.

Figure 41:
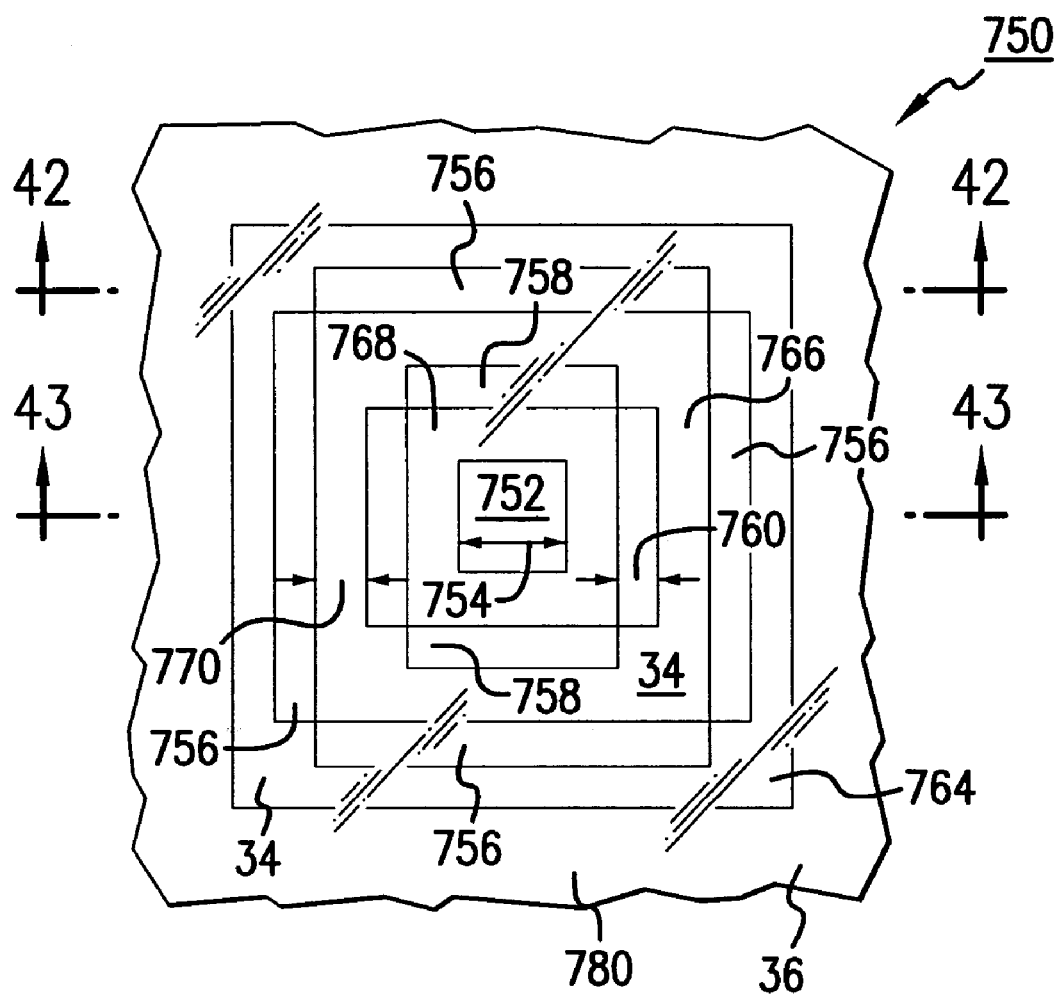
FIG. 41 is a plan view of another mask constructed in accordance with the invention.
Figure 42:
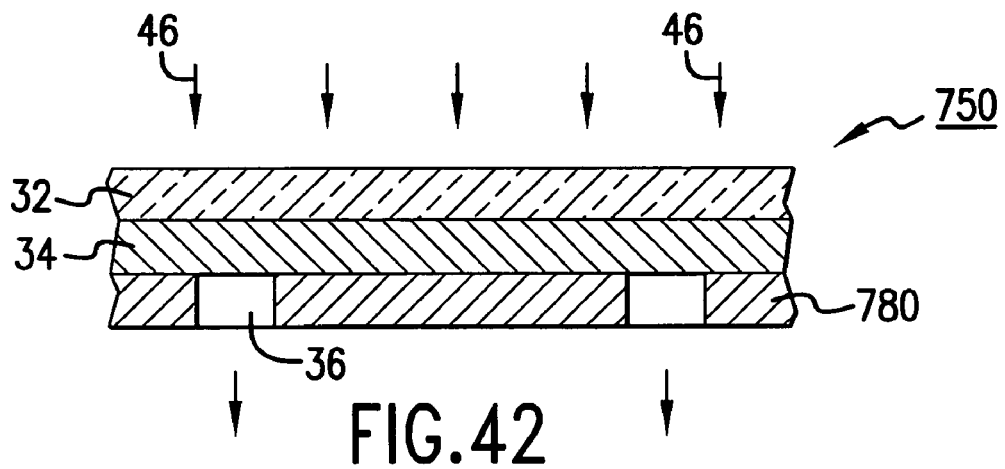
FIG. 42 is a cross-sectional view of the mask of FIG. 41, taken along the line 42—42.
Figure 43:
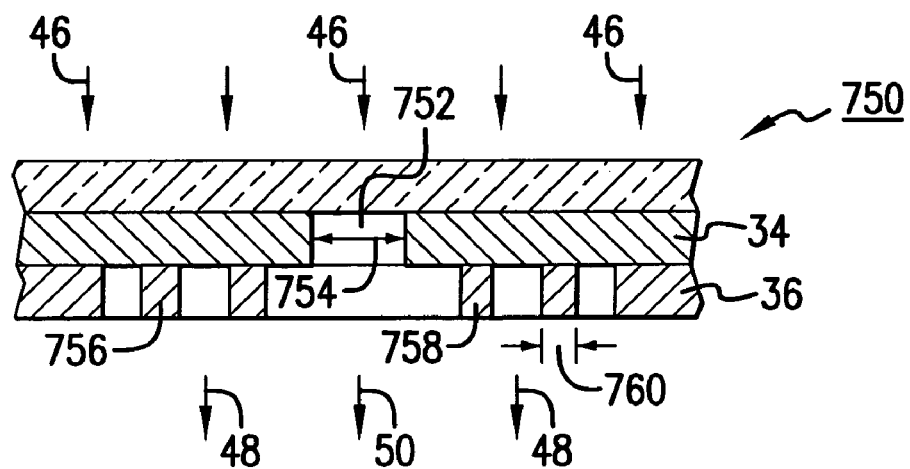
FIG. 43 is a cross-sectional view of the mask of FIG. 41, taken along the line 43—43.

FIGS. 41–43 show a microlithographic mask 750, with a rim that includes double opaque short bars, for producing an isolated contact hole in photoresist (not shown; diameter=about 0.12 µm). Like the masks discussed above, the mask 750 is formed of a transparent substrate 32, an attenuating phase shift layer 34, and an opaque layer 36. Throughout this specification, as noted above, like reference numerals designate like elements. Referring now to FIGS. 42 and 43, the attenuating phase shift layer 34 and the opaque layer 36 may be patterned to form a square transparent opening 752 (or "contact"; width 754=about 0.2 µm) and concentric frames formed of short bars 756, 758 (width 760=about 0.08 µm) whose ends do not overlap each other.

The transparent opening 752 is surrounded by the orthogonally arranged short bars 756, 758. The opaque frames 756, 758 define phase shifting assist features 764, 766, 768 in the partially transmissive layer 34. The separation distance 770 between the opaque frames 756, 758 may be about 0.1 μm, although changes may be made to the illustrated embodiments without departing from the scope of the present invention. The assist features 764, 766, 768 may be concentrically, alternatingly nested with the opaque frames 756, 758. The outermost assist feature 764 may be surrounded by an opaque background 780. The opaque background 780 is formed by a non-patterned region of the opaque layer 36.

In operation, incident light 46 (NA=about 0.63; σ=about 0.35) is transmitted through the isolated opening 752 and the assist features 764, 766, 768. The light 46, 48 that is transmitted through the assist features 764, 766, 768 is phase-shifted (by 180° or an odd multiple thereof) and attenuated relative to the light 46, 50 that is transmitted through the transparent opening 752. Thus, the transmitted light 48, 50 interacts to form the desired contact hole with minimal side lobing and improved depth of focus.

Figure 44:
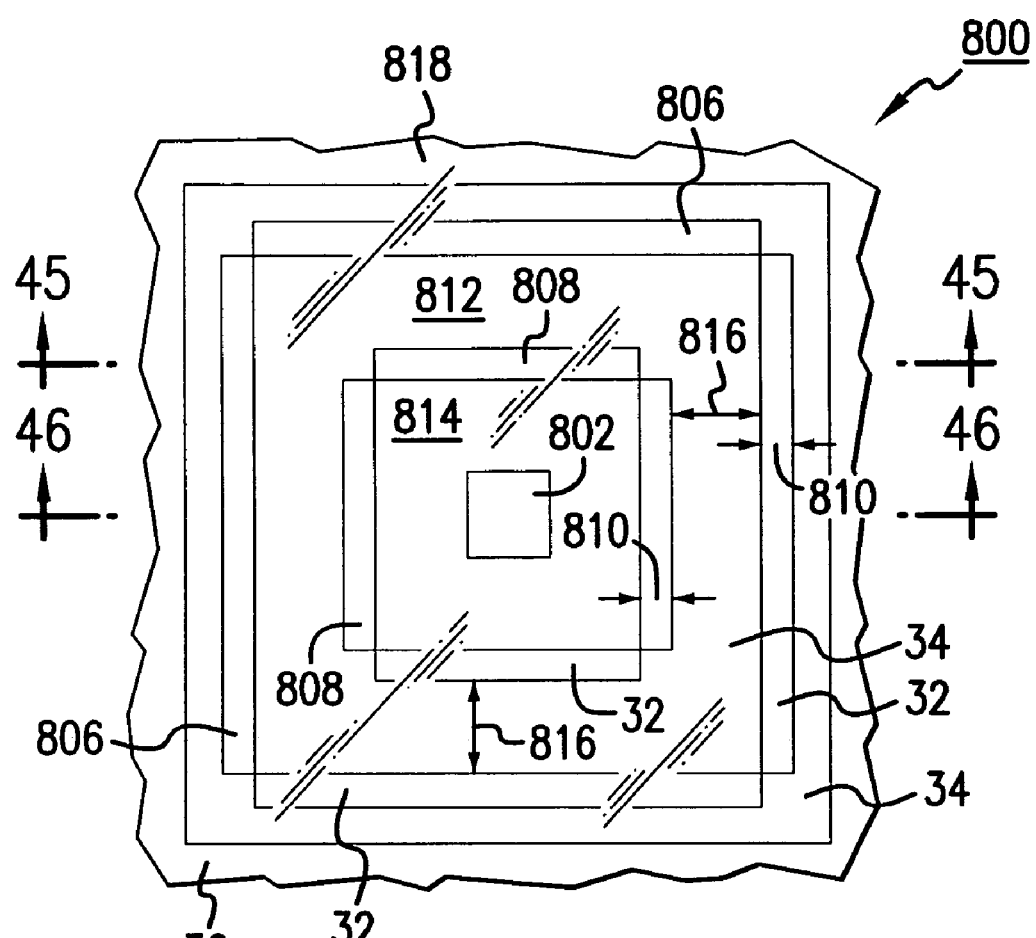
FIG. 44 is a plan view of another mask constructed in accordance with the invention.
Figure 45:
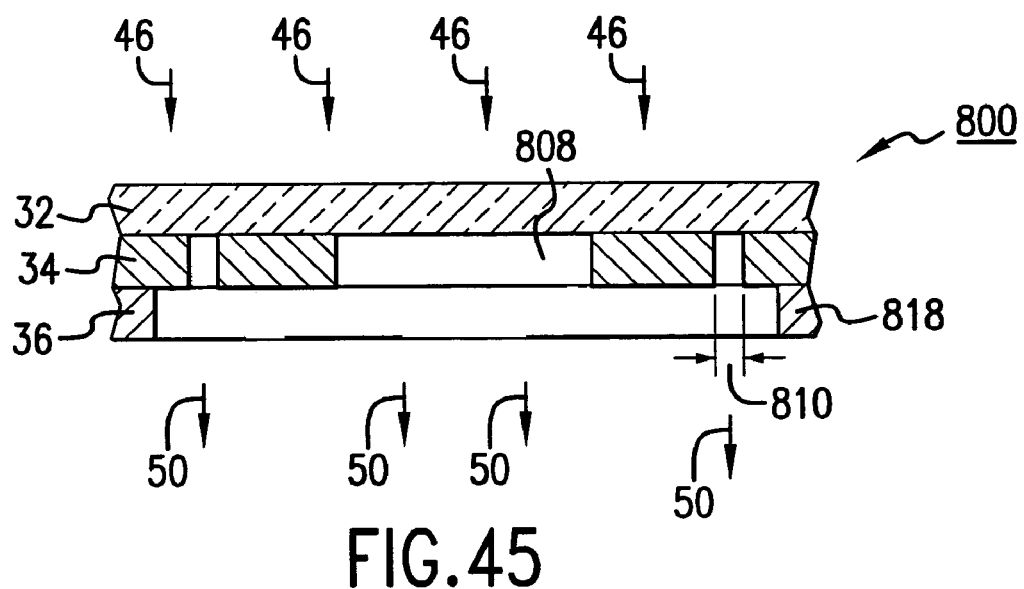
FIG. 45 is a cross-sectional view of the mask of FIG. 44, taken along the line 45—45.
Figure 46:
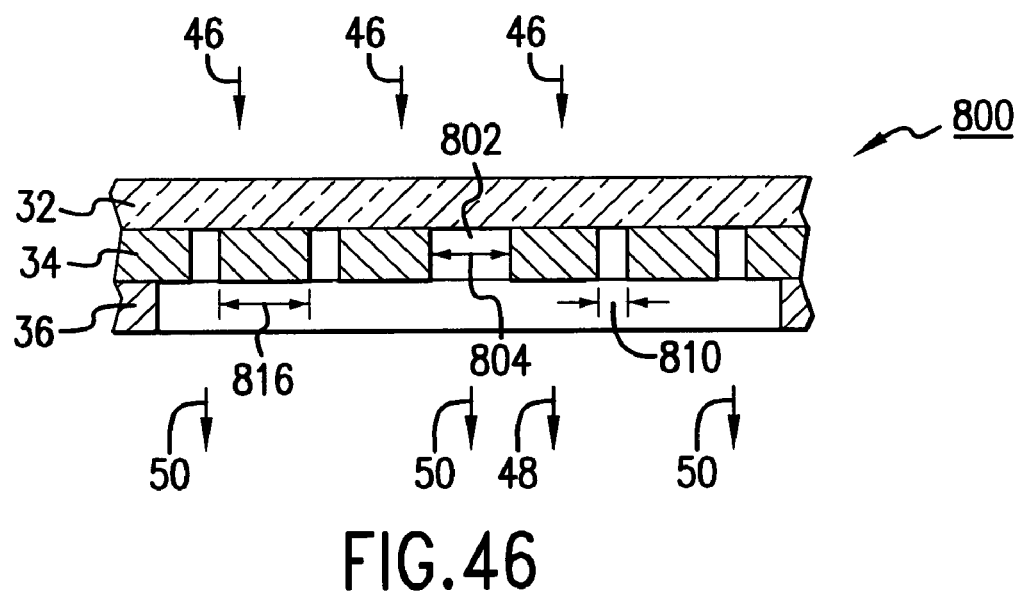
FIG. 46 is a cross-sectional view of the mask of FIG. 44, taken along the line 46—46.

FIG. 44 shows a microlithographic mask 800, with a rim that includes double transparent short bars, for producing an isolated contact hole in photoresist (not shown; diameter=about 0.12 μm). The mask 800 may be constructed generally like the mask 750 discussed above in connection with FIGS. 41–43 except that the concentric frames are transparent (i.e., patterned through the partially transmissive material 34) rather than partially transmissive (i.e., patterned only through the opaque layer 36). Referring now to FIGS. 45 and 46, the mask 800 may have a square transparent opening 802 (contact width 804=about 0.21 μm) and concentric frames formed of transparent short bars 806, 808 (width 810=about 0.08 μm) whose ends do not overlap each other.

The transparent opening 802 is surrounded by concentric assist features 812, 814 separated by and nested within the transparent bars 806, 808. The illustrated separation distance 816 may be, for example, about 0.22 μm. The opaque background 818 is formed by a non-patterned region of the device 800. In operation, incident light 46 (NA=about 0.63; σ=about 0.35) is transmitted through the isolated opening 802, the clear outrigger frames 806, 808, and the assist features 812, 814. The attenuated and phase shifted light 46, 48 interacts with the non-phase shifted light 46, 50 to form the desired contact hole with minimal side lobing and improved depth of focus.

In connection with FIGS. 1–46, all of the dimensions provided for the illustrated masks are at 1×, i.e., at the final dimensions on the wafer or photoresist within which the contact hole(s) is(are) formed. The masks may be fabricated at a larger scale, for example, at 4× or 5×, such that when the geometry is imaged onto the wafer, the image is shrunk by the scale factor. In addition, satisfactory results may be obtained even through the dimensions are not exactly as specified in the detailed description. For example, each dimension may be in a tolerance range of 10% plus or minus the value specified herein. The invention should not be limited to the specified dimensions and ranges, however, except to the extent such values are recited in the claims.

Further, please note that, although the structures shown in FIGS. 35–46 have two scattering bars per side, the invention may be employed with any number of bars per side, including one. The claimed invention should not be limited to the preferred embodiments shown and described in detail herein.

Figure 47:
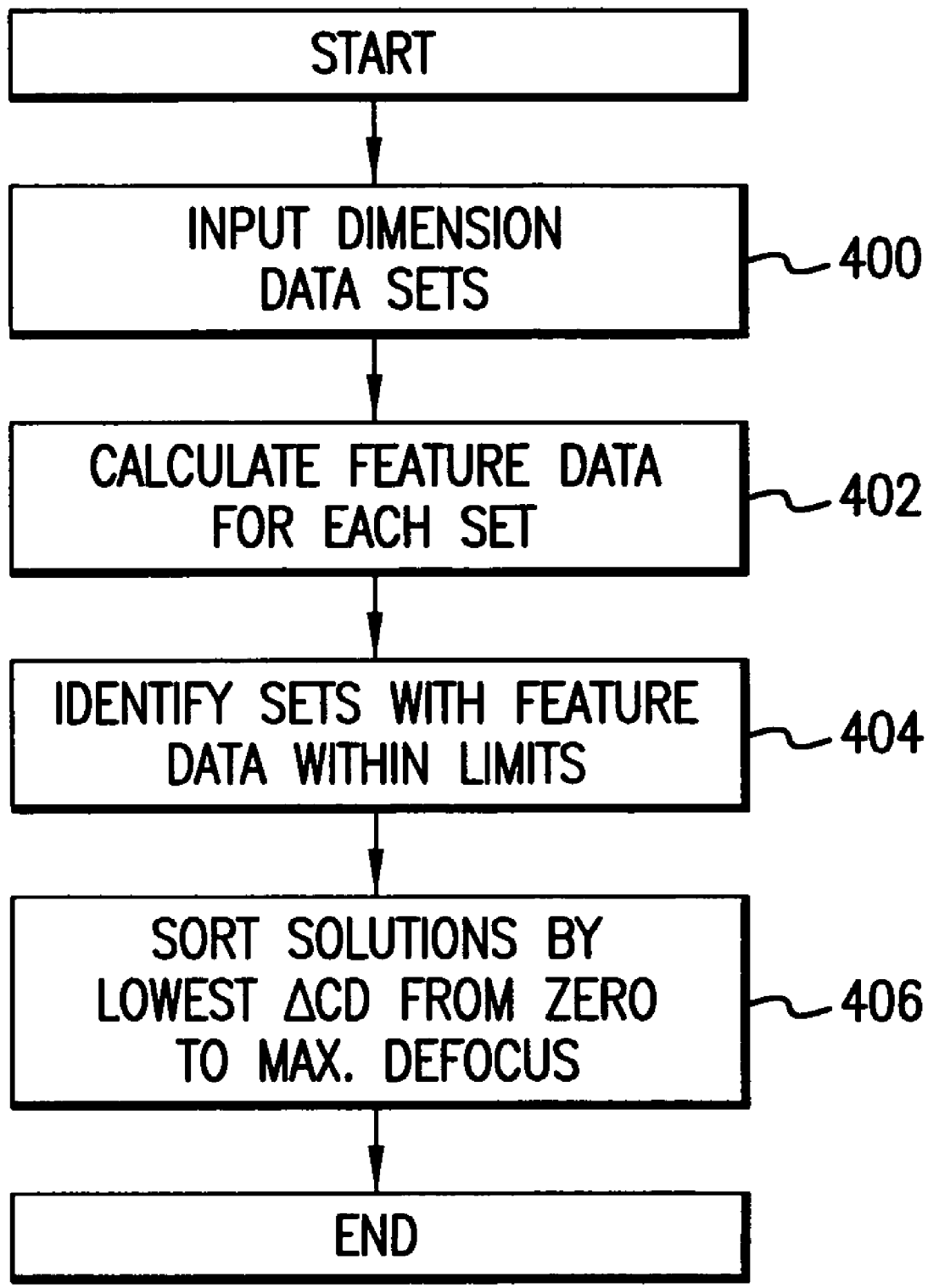
FIG. 47 is a flow chart for a method of designing a microlithographic mask in accordance with a preferred embodiment of the present invention.

Referring now to FIG. 47, there is shown a flow chart for a method of making and/or designing a multi-tone microlithographic mask in accordance with one aspect of the present invention. The method may be arranged to identify or select the one mask pattern, out of numerous mask patterns of the types shown in FIGS. 1–46, that provides the greatest depth of focus under given optical and feature conditions. The given conditions may relate to the optical and operational parameters of the microlithography system that will be used, the type of photoresist within which the contact holes or other features will be formed, and the design criteria, limits or tolerances on the geometry of the features to be formed in the photoresist. The latter design limits may include the desired critical dimension (CD), lack of side-lobing, etc. In a preferred embodiment of the invention, the design criteria may also include the image log-slope. The term "image log-slope," which is a well known term in the art, basically refers to the slope of the diffraction pattern. Higher slope provides an image with sharper edges, and therefore improved contrast.

In the illustrated method, sets of dimension data are input (Step 400) into a programmed microprocessor or the like. The sets of dimension data are representative of the planar dimensions of various mask patterns. Each set of dimension data may include the width of the transparent opening(s), the width or separation distance of any opaque frame(s), the width, separation distance or other planar dimensions of any partially transmissive rims, the widths of corner squares (opaque or partially transmissive), the relevant dimensions of other assist features, etc. The dimensions that make up the dimension data may be varied within predetermined ranges. The process of varying the dimension data and inputting the sets of dimension data into the system (Step 400) may be automated.

In a subsequent step (Step 402), calculations are carried out for each set of dimension data. The calculations provide feature data, for each set of dimension data, as a function of optical conditions. The feature data may be, for example, representative of the CD, ellipticity, side-lobing, etc. of the features that would be produced by a mask having the dimensions of the respective dimension data set. The feature data is calculated as a function of optical conditions such as intensity range, NA, σ etc. In addition, the feature data is calculated for zero, intermediate and maximum defocus conditions. At the conclusion of Step 402, there are multiple sets of feature data for each set of dimension data.

Subsequently, in Step 404, for a desired optical condition, the sets of dimension data that result in feature data within acceptable limits (design criteria) are identified. The number of sets of dimension data output from Step 404 is less than the number of sets input in Step 400. For example, for each optical condition (e.g., intensity or dose) considered in a range of optical condition values, the program investigates the calculated CD values as a function of dimension data, and discriminates according to the following design criteria: (1) CDs at zero, intermediate and maximum considered defocus conditions to be within tolerance of desired value; (2) ellipticity ((CDx−CDy)/(CDx+CDy)) to be within desired limits at zero defocus as well as on defocus. According to a preferred embodiment of the invention, the desired CD at a zero defocus condition may be about 0.12 μm, with a tolerance of about ±3%. The CD tolerance at an intermediate defocus condition (e.g., 0.40 μm) may be ±15%. The CD tolerance at a maximum considered defocus condition (e.g., ±0.6 um) may be, for example, ±30%.

Then, in Step 406, the one set of dimension data, from among the sets selected in Step 404, that achieves the smallest change in critical dimension (ΔCD) between a zero defocus condition and a maximum considered defocus condition is obtained by a sorting process. Note that the "intermediate defocus" is considered to provide a process latitude window within defocus values; however, to investigate depth of focus, a CD value is obtained at the maximum considered defocus condition.

Steps 400 and 402 may be performed on a microprocessor programmed with suitable imaging software, such as, for example, Solid C, Aerial Image version 5.5.11. The computer may be programmed in PERL script to define, write, and execute macros to analyze various surface dimensions like those mentioned above in connection with FIGS. 1–46.

Thus, the invention provides a method of forming a mask and the resulting structure to form contact holes in photoresist on semiconductor wafers. In an exemplary embodiment, a mask is formed with a transparent material mask substrate, attenuating phase shift material formed on the substrate, and opaque material regions formed on the attenuating phase shift material. The attenuating phase shift material and opaque (or partially transmissive) material are patterned to form a transparent hole. The dimensions of the patterns are determined using iterative methods and imaging software. An automated method is used to select the most desirable pattern for given conditions and design criteria. Certain dimensions, such as the size of the transparent opening and the size and spacing of the attenuating phase shift material and opaque material may be set as critical limits to reduce side lobes for a given illumination condition.

After a desired pattern is selected, then a mask, with the desired sub-resolution dimensions, is formed in the three-layer material 32, 34, 36 using electron beam lithography, ion milling, etc. Processes for forming the desired pattern in the three layer material 32–36 are described in U.S. Pat. No. 5,582,939 (Pierrat), for example. The entire disclosure of U.S. Pat. No. 5,582,939 is incorporated herein by reference.

The method described above may also be used to optimize the size of lines (as opposed to contacts) as well as the position and size of scattering bars. The method is applicable to the formation of lines and/or slots as well as for contacts.

Having thus described in detail certain exemplary embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of exemplary embodiments which can achieve the features and advantages of the invention. It is not intended that the invention be limited to the embodiments shown and described in detail herein. The invention is only limited by the scope of the following claims.

What is claimed is:

1. A microlithographic mask for forming a sub-resolution feature in photoresist with an acceptable process latitude, said mask comprising:
    a layer of transparent material;
    a layer of light-obstructing material; and
    a layer of attenuating phase shifting material located between said layer of transparent material and said layer of light-obstructing material; and
    wherein said layer of light-obstructing material and said layer of attenuating phase shifting material are patterned to form a transparent hole, a partially transmissive assist feature, and a light-obstructing frame located between said transparent hole and said partially transmissive assist feature.

2. The mask of claim 1, wherein said transparent hole is a rectangle.

3. The mask of claim 2, wherein said light-obstructing frame includes an opaque frame, and wherein said opaque frame surrounds said transparent hole.

4. The mask of claim 3, wherein said partially transmissive feature includes a partially transmissive frame surrounding said opaque frame.

5. The mask of claim 4, wherein said layer of light-obstructing material includes a layer of opaque material, and wherein said layer of opaque material includes an opaque background surrounding said partially transmissive frame.

6. The mask of claim 1, wherein said layer of transparent material includes quartz.

7. The mask of claim 6, wherein said layer of attenuating phase shifting material includes a material selected from the group consisting of MoSi, chromium fluoride, silicon nitride, titanium nitride, tantalum silicide and zirconium silicon oxide.

8. The mask of claim 7, wherein said attenuating phase shifting material is deposited on said quartz.

9. The mask of claim 7, wherein the transmissivity of said layer of attenuating phase shifting material relative to said layer of transparent material is in the range of from about 6% to 100%.

10. The mask of claim 7, wherein said layer of light-obstructing material includes chrome.

11. The mask of claim 1, further comprising a partially transmissive frame, said layer of phase-shifting material being located between said transparent hole and partially transmissive frame.

12. A microlithographic mask, comprising:
    transparent material; and
    patterned opaque material and phase shifting material, said patterned materials defining an opening, an opaque frame surrounding said opening, sub-resolution bars surrounding said frame, and opaque corners located between sub-resolution bars.

13. The mask of claim 12, wherein said transparent material includes quartz.

14. The mask of claim 13, wherein said phase shifting material is partially transmissive relative to said transparent material.

15. The mask of claim 14, wherein said opaque material includes metal deposited on said phase shifting material.

16. A mask for forming an array of sub-resolution features, said mask comprising:
    a layer of transparent material;
    a layer of light-obstructing material; and
    a layer of attenuating phase shifting material located between said layer of transparent material and said layer of light-obstructing material; and
    wherein said layer of light-obstructing material and said layer of attenuating phase shifting material are patterned to form transparent holes and light-obstructing frames surrounding said transparent holes.

17. The mask of claim 16, further comprising partially transmissive features surrounding said light-obstructing frames.

18. The mask of claim 17, further comprising opaque corners on said partially transmissive features.

19. A multi-tone mask for forming sub-resolution features, said mask comprising:
    a first layer of attenuating phase shifting material, said layer defining openings corresponding to said sub-resolution features; and
    a second layer of material for preventing incident light from propagating through said first layer, said second layer including frames surrounding said openings, and wherein said second layer defines bar-shaped partially transmissive assist features.

20. The mask of claim 19, wherein phase-shifted light transmitted through one of said bar-shaped partially transmissive assist features operatively interacts with light transmitted through said openings.

21. A mask for forming an elliptical feature in photoresist, said mask comprising:
   a layer of transparent material;
   a layer of opaque material; and
   a layer of attenuating phase shifting material located between said layer of transparent material and said layer of opaque material; and
   wherein said layer of opaque material and said layer of attenuating phase shifting material are patterned to form transparent holes and opaque frames surrounding said transparent holes.

22. The mask of claim 21, further comprising an array of rectangular openings, and attenuating phase shifting bars located between said rectangular openings.

23. The mask of claim 22, further comprising a patterned layer of opaque material for defining said attenuating phase shifting bars.

24. The mask of claim 23, further comprising a transparent substrate for supporting said attenuating phase shifting bars and said patterned layer of opaque material.

25. A method of making a multi-tone microlithographic mask, said method comprising:
   providing sets of dimension data representative of mask patterns;
   for each set of dimension data, calculating feature dimension data as a function of optical conditions; and
   for a desired optical condition, identifying the sets of dimension data that have feature dimension data within desired limits.

26. The method of claim 25, further comprising the step of selecting the one set of dimension data that achieves the smallest change in critical dimension between a zero defocus condition and a maximum considered defocus condition.

27. The method of claim 26, wherein said dimension data includes the widths of transparent openings in said patterns.

28. The method of claim 25, wherein said feature dimension data define opaque corner structures.

29. The method of claim 25, wherein said feature dimension data define partially transmissive corner structures.

* * * * *

UNITED STATES PATENT AND TRADEMARK OFFICE
CERTIFICATE OF CORRECTION

PATENT NO. : 7,008,738 B2
APPLICATION NO. : 10/847337
DATED : March 7, 2006
INVENTOR(S) : H. D. Dulman et al.

It is certified that error appears in the above-identified patent and that said Letters Patent is hereby corrected as shown below:

In the Title of the patent:

"MICROLITHOGRAPHIC STRUCTURES AND METHOD OF FABRICATION"

should read --MICROLITHOGRAPHIC MASK STRUCTURES AND METHOD OF FABRICATION--.

Signed and Sealed this

Twenty-fifth Day of July, 2006

JON W. DUDAS
*Director of the United States Patent and Trademark Office*